US008432193B2

(12) United States Patent
Marutani

(10) Patent No.: US 8,432,193 B2
(45) Date of Patent: Apr. 30, 2013

(54) DIVIDER AND MIXER CIRCUIT HAVING THE SAME

(75) Inventor: Masazumi Marutani, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 20 days.

(21) Appl. No.: 13/189,256

(22) Filed: Jul. 22, 2011

(65) Prior Publication Data

US 2012/0081170 A1 Apr. 5, 2012

(30) Foreign Application Priority Data

Oct. 1, 2010 (JP) ................................ 2010-223938

(51) Int. Cl.
*H03B 19/00* (2006.01)

(52) U.S. Cl.
USPC ............ 327/117; 327/118; 327/120; 327/122

(58) Field of Classification Search .................. 327/115, 327/116, 117, 118, 355–361, 202, 203, 208–212, 327/218; 377/47, 48
See application file for complete search history.

(56) References Cited

U.S. PATENT DOCUMENTS

| | | | | |
|---|---|---|---|---|
| 5,122,677 | A * | 6/1992 | Sato | 327/99 |
| 5,764,711 | A * | 6/1998 | Jokura | 375/376 |
| 6,157,694 | A * | 12/2000 | Larsson | 377/48 |
| 7,342,430 | B1 * | 3/2008 | Chiang | 327/295 |
| 7,635,999 | B1 * | 12/2009 | Jamal | 327/117 |
| 8,089,304 | B1 * | 1/2012 | Jamal | 327/117 |
| 2005/0213699 | A1 * | 9/2005 | Boerstler et al. | 377/47 |
| 2005/0258879 | A1 | 11/2005 | Marutani | |
| 2009/0243668 | A1 * | 10/2009 | Zhang et al. | 327/117 |
| 2010/0141306 | A1 * | 6/2010 | Doi et al. | 327/117 |

FOREIGN PATENT DOCUMENTS

| | | |
|---|---|---|
| JP | 53-76731 | 7/1978 |
| JP | 2005-333567 A | 12/2005 |

* cited by examiner

*Primary Examiner* — Lincoln Donovan
*Assistant Examiner* — Brandon S Cole
(74) *Attorney, Agent, or Firm* — Arent Fox LLP

(57) ABSTRACT

A divider has a clock generation circuit which combines a first trigger clock and a second trigger clock having a first phase difference, so as to generate a third clock having pulse edges corresponding to pulse edges of the first trigger clock and the second trigger clock; an output dividing circuit which divides the frequency of the third clock in half so as to generate a first differential output clock and a second differential output clock having a duty ratio corresponding to the first phase difference; and a phase correction circuit which detects a phase of the first output clock or the second output clock at a timing of the pulse edge of the first trigger clock or the second trigger clock, so as to generate a phase correction signal for resetting the output dividing circuit when the detected phase is not a normal phase.

16 Claims, 37 Drawing Sheets

DIVIDER 32

IN THE CASE OF DESIRABLE STARTUP (N605 CHANGES N613 FROM L TO H)
[ = N606 CHANGES N614 FROM L TO H]

IN THE CASE OF UNDESIRABLE STARTUP (N605 CHANGES N613 FROM H TO L)
[= N606 CHANGES N614 FROM H TO L] PHASE SHIFT IS DETECTED AND CORRECTED

FIG. 23A1
IN THE CASE OF DESIRABLE STARTUP (N605 CHANGES N613 FROM L TO H)
[= N606 CHANGES N614 FROM L TO H]
<PHASES OF N613 AND N618 ARE THE SAME, PHASE OF N614 AND N618 ARE THE OPPOSITE>
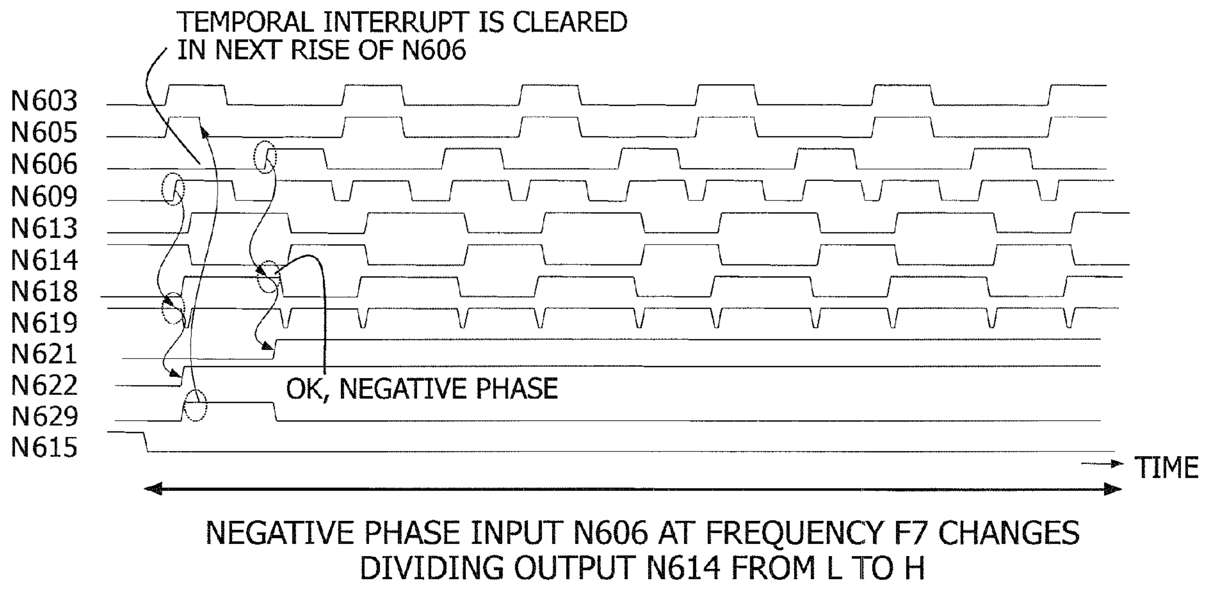

FIG. 23A2
IN THE CASE OF DESIRABLE STARTUP (N605 CHANGES N613 FROM L TO H)
[= N606 CHANGES N614 FROM L TO H]
<PHASES OF N613 AND N618 ARE THE OPPOSITE, PHASES OF N614 AND N618 ARE THE SAME>
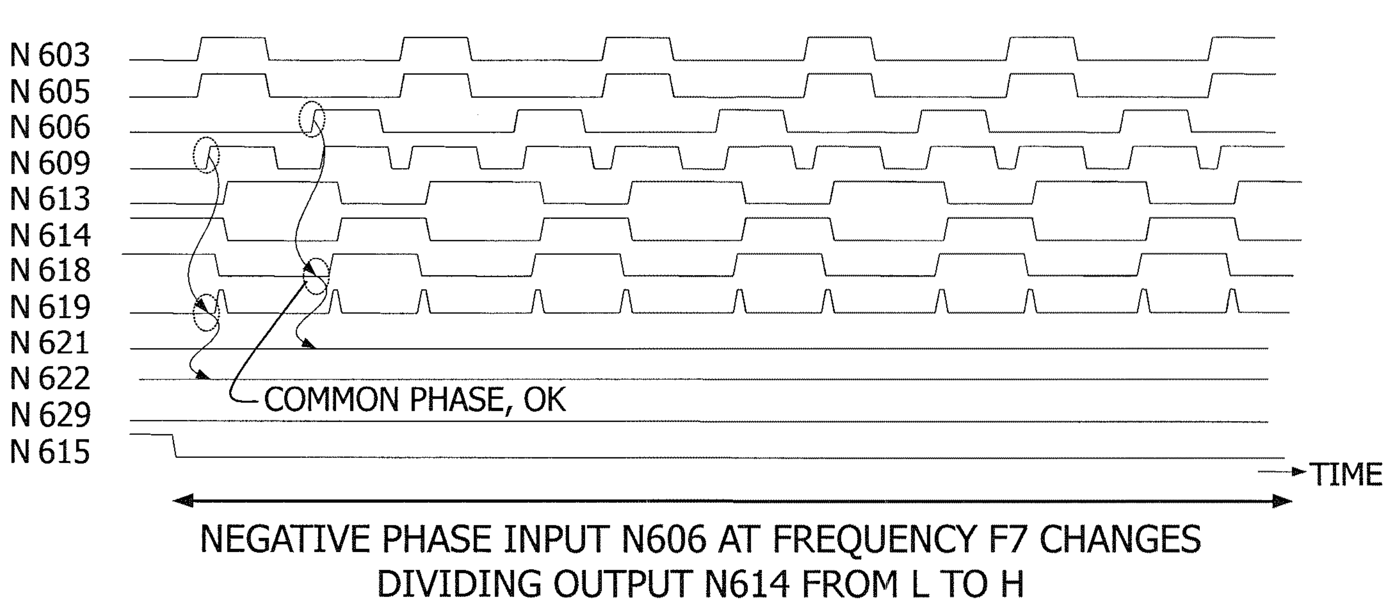

FIG. 24B1
IN THE CASE OF UNDESIRABLE STARTUP (N605 CHANGES N613 FROM H TO L)
[= N606 CHANGES N614 FROM H TO L] PHASE SHIFT IS DETECTED AND CORRECTED
<PHASES OF N613 AND N618 ARE THE SAME, AND PHASES OF N614 AND N618 ARE THE OPPOSITE>
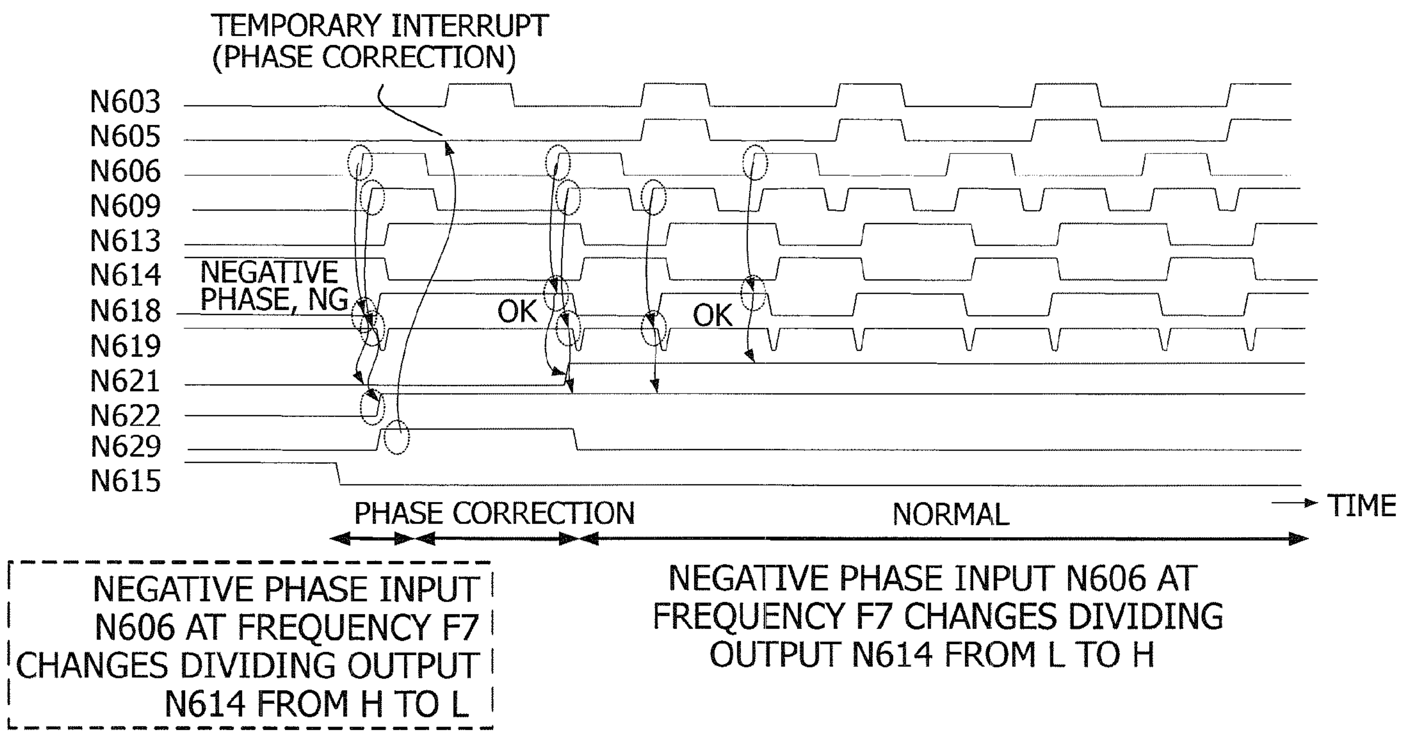

FIG. 24B2
IN THE CASE OF UNDESIRABLE STARTUP (N605 CHANGES N613 FROM H TO L)
[= N606 CHANGES N614 FROM H TO L] PHASE SHIFT IS DETECTED AND CORRECTED
<PHASES OF N613 AND N618 ARE THE OPPOSITE, PHASES OF N614 AND N618 ARE THE SAME>
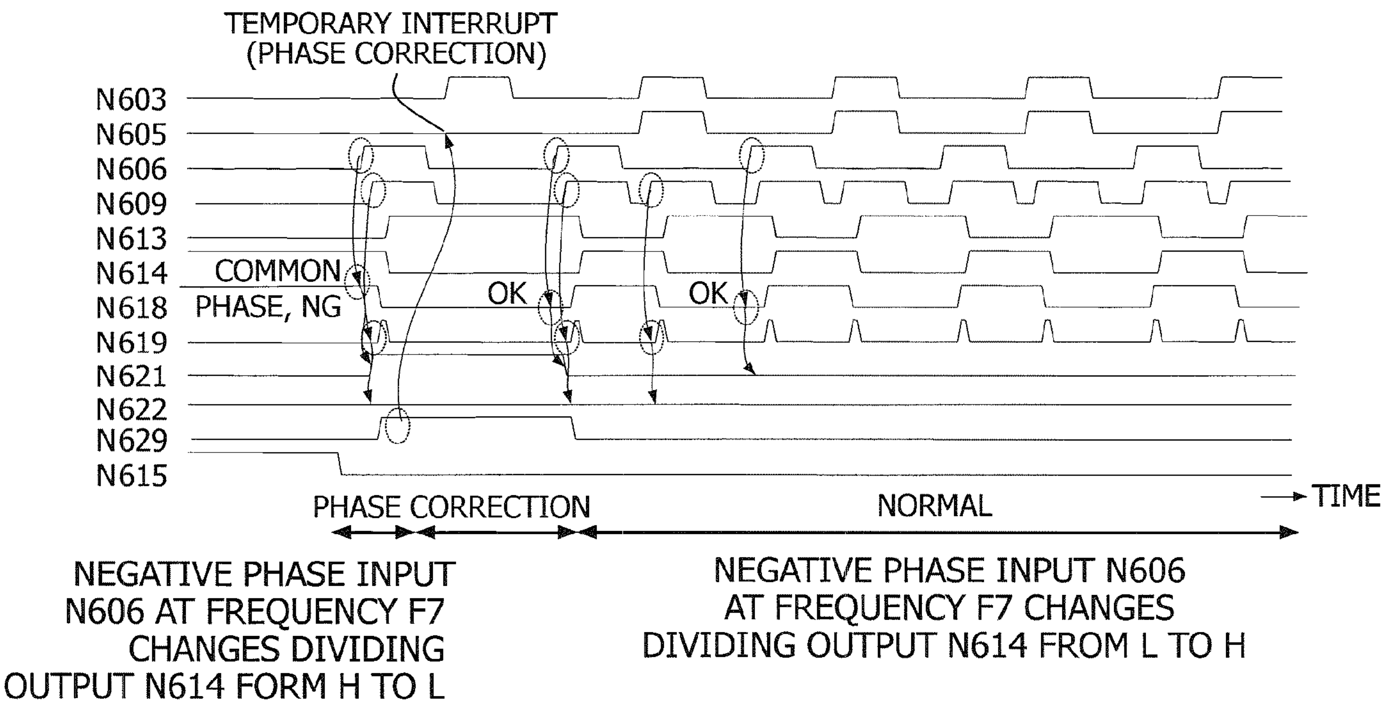

FIG. 25

| STATE | A1 NORMAL | A2 NORMAL | B1 ABNORMAL | B2 ABNORMAL |
|---|---|---|---|---|
| CHANGE OF N613 CAUSED BY N605<br>CHANGE OF N614 CAUSED BY N606 | L⇒H | | H⇒L | |
| PHASE RELATIONSHIP OF N613 AND N618<br>(PHASE RELATIONSHIP OF N614 AND N618) | COMMON PHASE (NEGATIVE PHASE) | NEGATIVE PHASE (COMMON PHASE) | COMMON PHASE (NEGATIVE PHASE) | NEGATIVE PHASE (COMMON PHASE) |
| OUTPUT N620 OF B621<br>CHANGE OF SUB-DIVIDER B618 IN PHASE DETECTION UNIT CAUSED BY N606 | H (H⇒L) | L (L⇒H) | L (L⇒H) | H (H⇒L) |
| OUTPUT N619 OF EXOR (B622)<br>(PHASE RELATIONSHIP OF INVERTED OUTPUT N614 OF OUTPUT DIVIDER B614 AND OUTPUT N618 OF SUB-DIVIDER B618) | H (NEGATIVE PHASE) | L (COMMON PHASE) | H (NEGATIVE PHASE) | L (COMMON PHASE) |
| N629<br>PHASE SHIFT DETECTION SIGNAL<br>(PHASE CORRECTION SIGNAL) | L | | H PHASE CORRECTION EXECUTE | |
| FINALLY CONVERTED STATE | A1 | A2 | A1 | A2 |
| CHANGE OF N613 CAUSED BY N605 AFTER PHASE CORRECTION<br>CHANGE OF N614 CAUSED BY N606 AFTER PHASE CORRECTION | L⇒H | | | |

IN THE CASE OF DESIRABLE STARTUP (N605 CHANGES N613 FROM L TO H)
[= N606 CHANGES N614 FROM L TO H]
<PHASES OF N613 AND N618 ARE THE SAME>

70

DIVIDER AND MIXER CIRCUIT HAVING THE SAME

CROSS-REFERENCE TO RELATED APPLICATION

This application is based upon and claims the benefit of priority of the prior Japanese Patent Application No. 2010-223938, filed on Oct. 1, 2010, the entire contents of which are incorporated herein by reference.

FIELD

The embodiment relates to a divider and a mixer circuit having the same.

BACKGROUND

A divider divides an input clock having a first frequency so as to generate an output clock having a second frequency according to the dividing ratio. The following technology, for example, is known for a divider.

In the case of a ½ divider, a differential clock generated by an oscillator is input, and an output clock having a half frequency of the differential clock is generated, for example. Therefore the output clock of which frequency has been divided in half has a phase shift corresponding to the phase difference 180° of the differential clock, and this phase difference is 90° of the output clock of which frequency has been divided in half. The output clock having a 90° phase difference is used as a local clock of a mixer circuit of a transmitting apparatus or a mixer circuit of a receiving apparatus in radio communication, such as digital TV broadcasting and portable telephones. This mixer circuit is, for example, an orthogonal modulation circuit, an image removal circuit, and an orthogonal demodulation circuit.

The phase accuracy of the local clock used for a mixer circuit of a transmitting apparatus or a receiving apparatus has a major influence on the quality of a transmission signal or a reception signal. Therefore a divider is demanded to generate highly accurate phase difference 90° of the local clock, which is the output of the divider.

SUMMARY

As mentioned above, the divider inputs differential input clocks, and generates output clocks of which phase is shifted 90° using the phase difference 180° of the input clocks. Hence if the phase difference of the input clocks is shifted from 180°, the phase difference of the output clocks is also shifted from 90°. Furthermore, the divider inverts the output clocks at a timing of a rise edge (or a fall edge) of the differential input clocks. Therefore if the phase difference of the differential input clocks is shifted from 180°, the duty ratio of the output clocks enters one of two states, depending on which input clock out of the differential input clocks is input to the divider first. Such dispersion of the duty ratio is hard to predict, and this makes it difficult to adjust the duty ratio by phase adjustment.

According to one aspect of an embodiment, a divider has a clock generation circuit which combines a first trigger clock and a second trigger clock having a first phase difference, so as to generate a third clock having pulse edges corresponding to pulse edges of the first trigger clock and the second trigger clock; an output dividing circuit which divides the frequency of the third clock in half so as to generate a first differential output clock and a second differential output clock having a duty ratio corresponding to the first phase difference; and a phase correction circuit which detects a phase of the first output clock or the second output clock at a timing of the pulse edge of the first trigger clock or the second trigger clock, so as to generate a phase correction signal for resetting the output dividing circuit when the detected phase is not a normal phase.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 23A1 and FIG. 23A2 are waveform diagrams of the divider according to the second embodiment.

FIG. 24B1 and FIG. 24B2 are waveform diagrams of the divider according to the second embodiment.

FIG. 25 is a table summarizing the four operations depicted in FIG. 23 and FIG. 24.

DESCRIPTION OF EMBODIMENTS

Figure 1A:
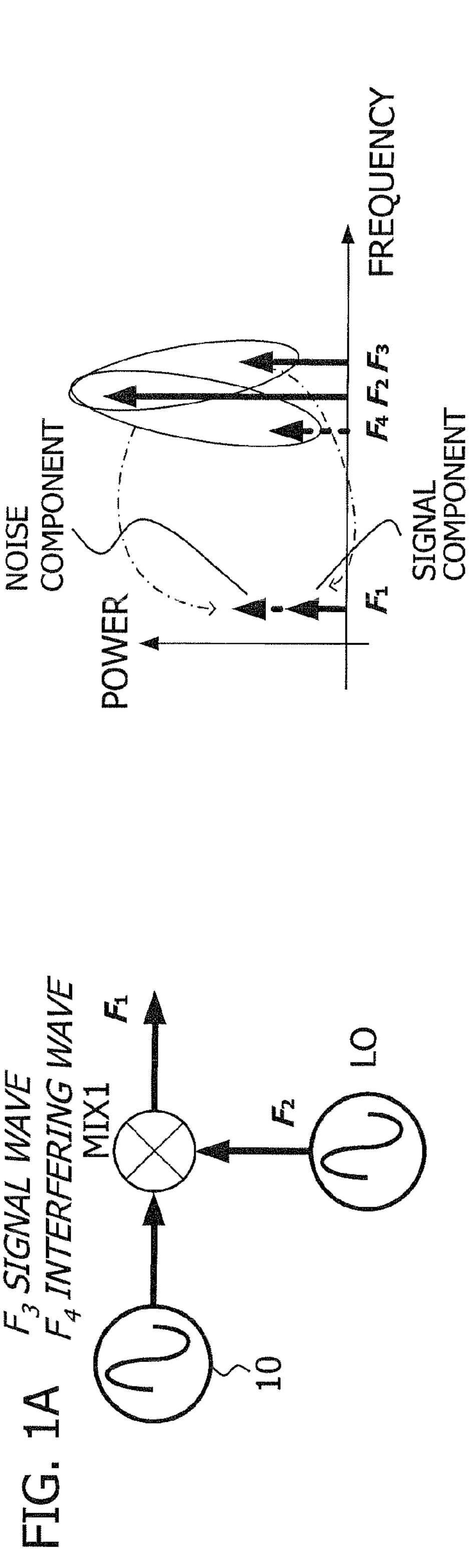
FIG. 1A and FIG. 1B illustrate examples of a mixer according to the present embodiment.
Figure 1B:
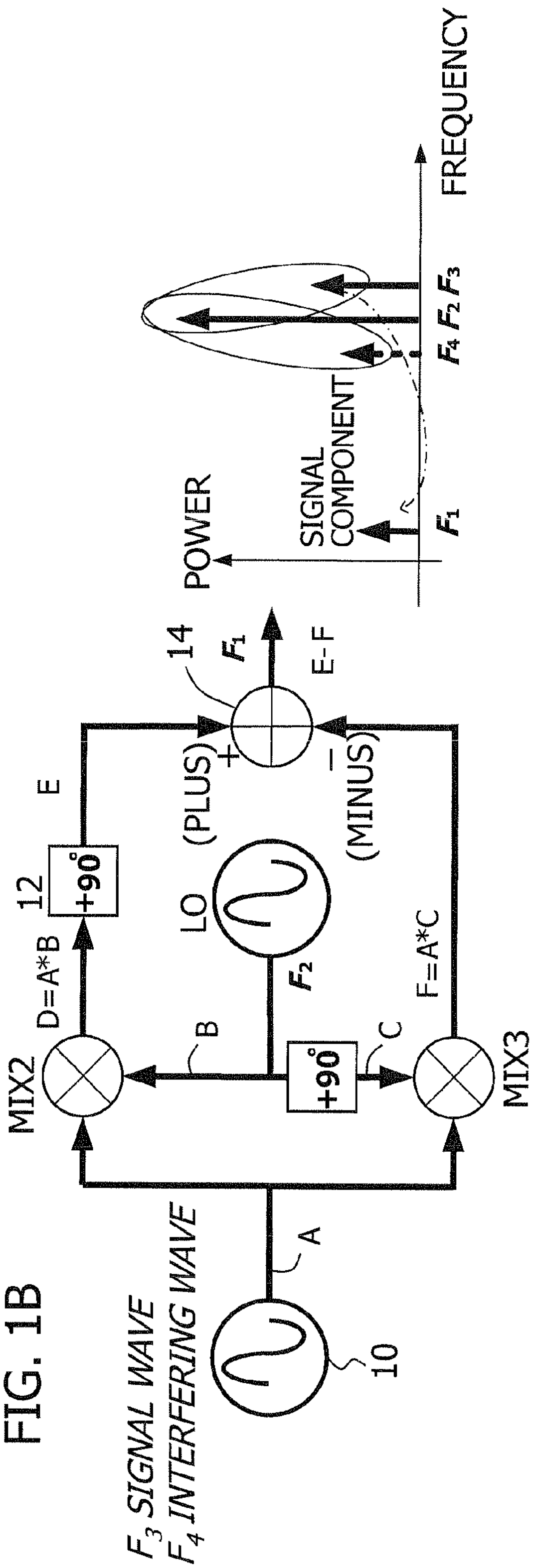

FIG. 1A and FIG. 1B illustrate examples of a mixer according to the present embodiment. FIG. 1A is a mixer MIX1 which multiplies a signal from a signal source 10 by an output signal of a local clock generation circuit LO. The signal of the signal source 10 includes a desired signal wave at frequency F3 and an interfering wave at frequency F4, and the frequency F4 of the interfering wave is located at the opposite side of the frequency F3 of the signal wave with respect to a local frequency F2.

In this case, an output signal of the mixer MIX1 at frequency F1 includes a signal at frequency (F3–F2) and a signal at frequency (F2–F4), and the output signal F1 of the mixer includes a noise component (F2–F4) in addition to the signal component (F3–F2). FIG. 1B illustrates an image removal mixer. The image removal mixer has a first mixer MIX2 which multiplies a signal A of the signal source 10 by a signal B at frequency F2, which is generated by the local clock generation circuit LO, and a second mixer MIX3 which multiplies the signal A of the signal source 10 by a signal C generated by shifting 90° the phase of the signal B at frequency F2 generated by the local clock generation circuit LO. The image removal mixer has a phase shifter 12 which shifts 90° the phase of a multiplication signal D generated by multiplying the signal A by the signal B, and a subtractor 14 which subtracts the output E of the phase shifter 12 from the output F of the second mixer MIX3.

In the subtractor 14, signal components at frequency F2 to F4 included in the multiplication signals D=A*B and F=A*C respectively, and components of the image signal F4 are removed from the output signal F1.

A transmitting apparatus has an orthogonal modulation circuit which has a pair of mixers for multiplying a baseband transmission signal by local clock signals of which phases are 90° different. In the same manner, a receiving apparatus has an orthogonal demodulation circuit which has a pair of mixers for multiplying a high frequency reception signal by local clock signals of which phases are 90° different.

In the image removal mixer, the orthogonal modulation circuit and the orthogonal demodulation circuit, the phase accuracy of the local clock causes major influence on the communication quality, so it is demanded that the phase difference of the local clock matches 90° with high precision.

Figure 2:
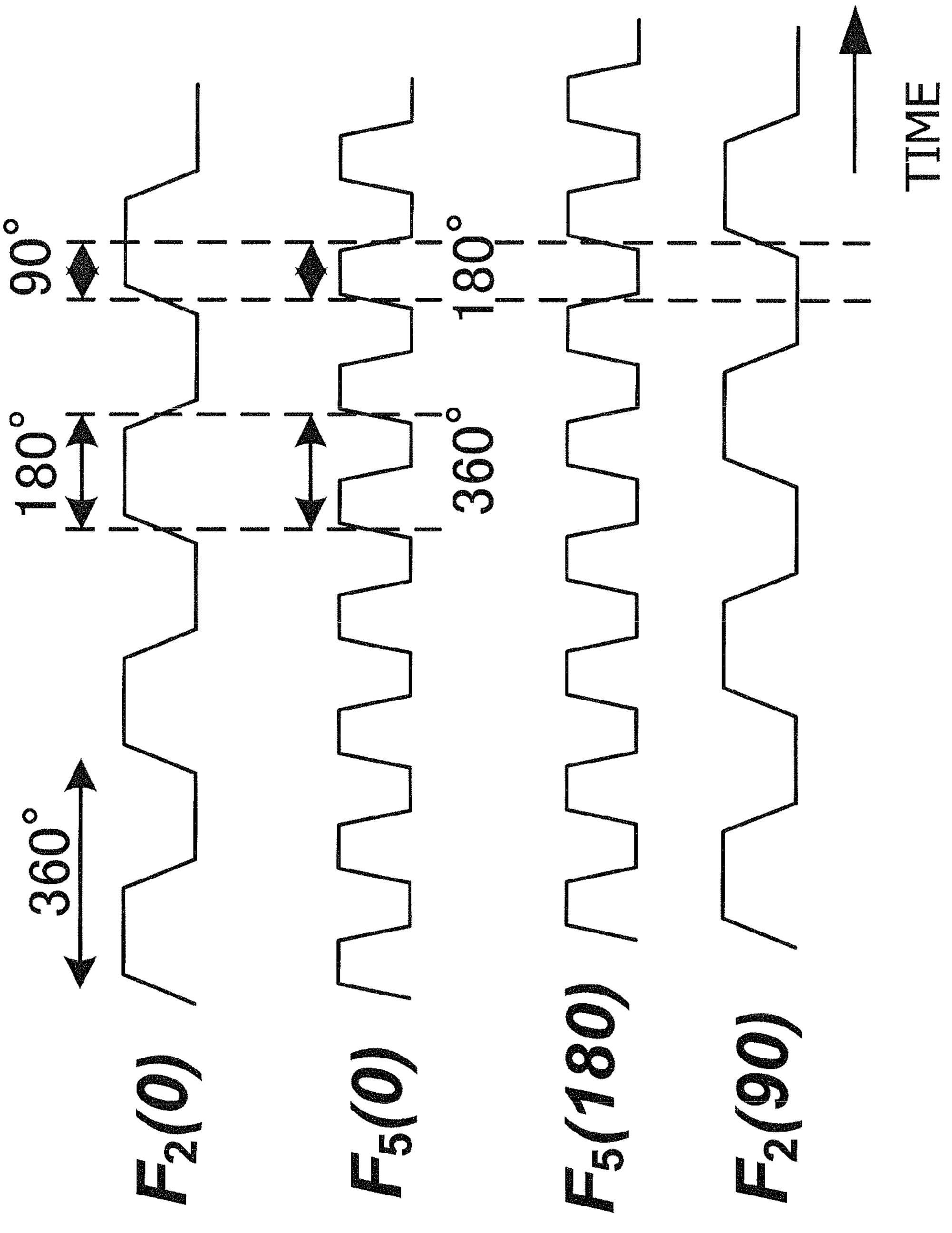
FIG. 2 illustrates a relationship of signals of which frequency is divided in half.

FIG. 2 illustrates a relationship of signals of which frequency is divided in half. Local clocks of which phases are 90° different are generated by a dividing circuit. The dividing circuit divides a clock at a certain frequency F5 in half so as to generate a clock at frequency F2. The frequency F2 is half of the frequency F5, and has a double cycle. Hence the phases 360° and 180° of the frequency F5 correspond to the phases 180° and 90° to the frequency F2.

Hence a clock F2(0) generated by dividing a clock F5(0) having frequency F5 with phase 0° in half is a clock having frequency F2=F5/2 with phase 0°, and a clock F2(90) generated by dividing a clock F5(180) having frequency F5 with phase 180° in half is a clock having frequency F2=F5/2 with phase 90°. By dividing the frequencies of differential clocks F5(0) and F5(180) in half like this, clocks F2(0) and F2(90) of which phases are shifted 90° can be generated. These clocks F2(0) and F2(90) can be used as the two sets of local clocks B and C in FIG. 1B.

Figure 3:
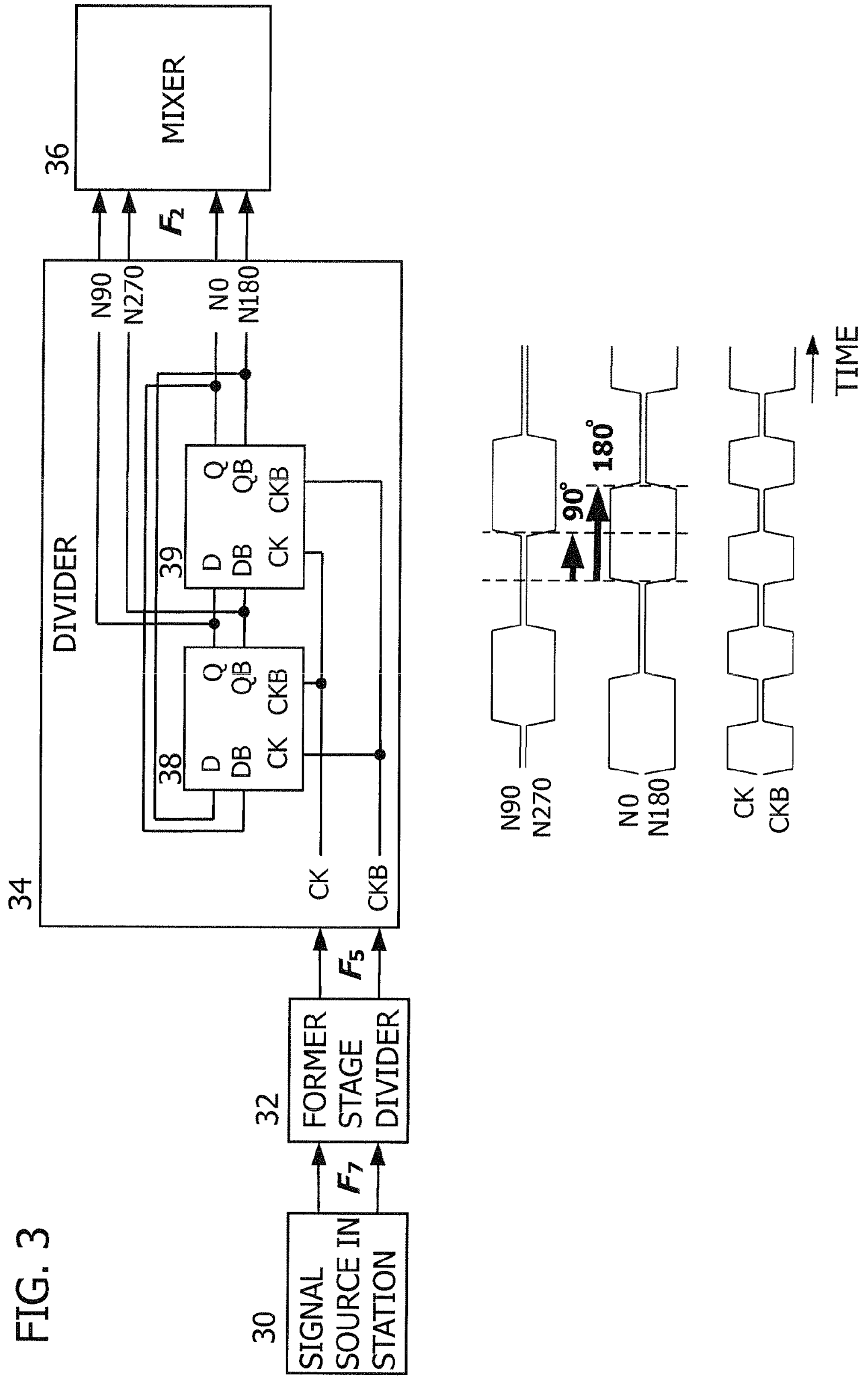
FIG. 3 illustrates a local signal generation circuit for generating local clocks of which phase difference is 90°.

FIG. 3 illustrates a local signal generation circuit for generating local clocks of which phase difference is 90°. In this local signal generation circuit, a signal source 30, such as an oscillator to a station, generates a clock at frequency F7, and a former stage divider 32 divides this clock so as to generate a clock at frequency F5. This clock F5 is a differential clocks of which phases are shifted 180°, and the differential clocks CK and CKB are input to the divider 34. In FIG. 3, signal waveforms of the differential clocks CK and CKB are also depicted.

A divider 34 has two stages of latches 38 and 39, which latch the inputs D and DB responding to the differential clocks CK and CKB, and output the latched inputs D and DB to the outputs Q and QB. To be more precise, when CK becomes H level, the inputs D and DB are latched, and the latched inputs D and DB are at the same time output to the outputs Q and QB, and when CK becomes L level, the outputs Q and QB in the previous time when CK was H level are held, regardless of the values of the inputs D and DB. The two stages of latches 38 and 39 constitute one D flip-flop, and the output Q and the output QB of the latch 39 are connected to the input DB and input D of the latch 38 respectively so as to constitute a ring counter. Therefore the outputs of the two stages of the latches 38 and 39 change responding to the fall edge and the rise edge of the clock F5. Due to this, the output clocks N0 and N180 of which phases are 0° and 180° are output from the latch 39 in the latter stage, and output clocks N90 and N270 of which phases are 90° and 270° are output from the latch 38 in the former stage, and these output clocks have half the frequency of the input clock F5. In other words, the differential output clocks (N0 and N180) and (N90 and N270) have a 90° phase difference respectively, and are used as the local clocks to be input to the mixers.

In this way, the phase difference of the output clocks (N0 and N180) and (N90 and N270) of the divider 34 corresponds to the time between the rise edge and the fall edge of the input clocks CK and CKB. Therefore if the duty ratio, which is an H level period with respect to the clock cycle of the input clocks CK and CKB, is 0.5, in other words, if the H level period and the L level period are equal, then the phase difference of the output clocks (N0 and N180) and (N90 and N270) can become 90° accurately. If the duty ratio of the input clocks CK and CKB is shifted from 0.5, the phase difference of the output clocks (N0 and N180) and (N90 and N270) shifts from 90°.

Figure 4:
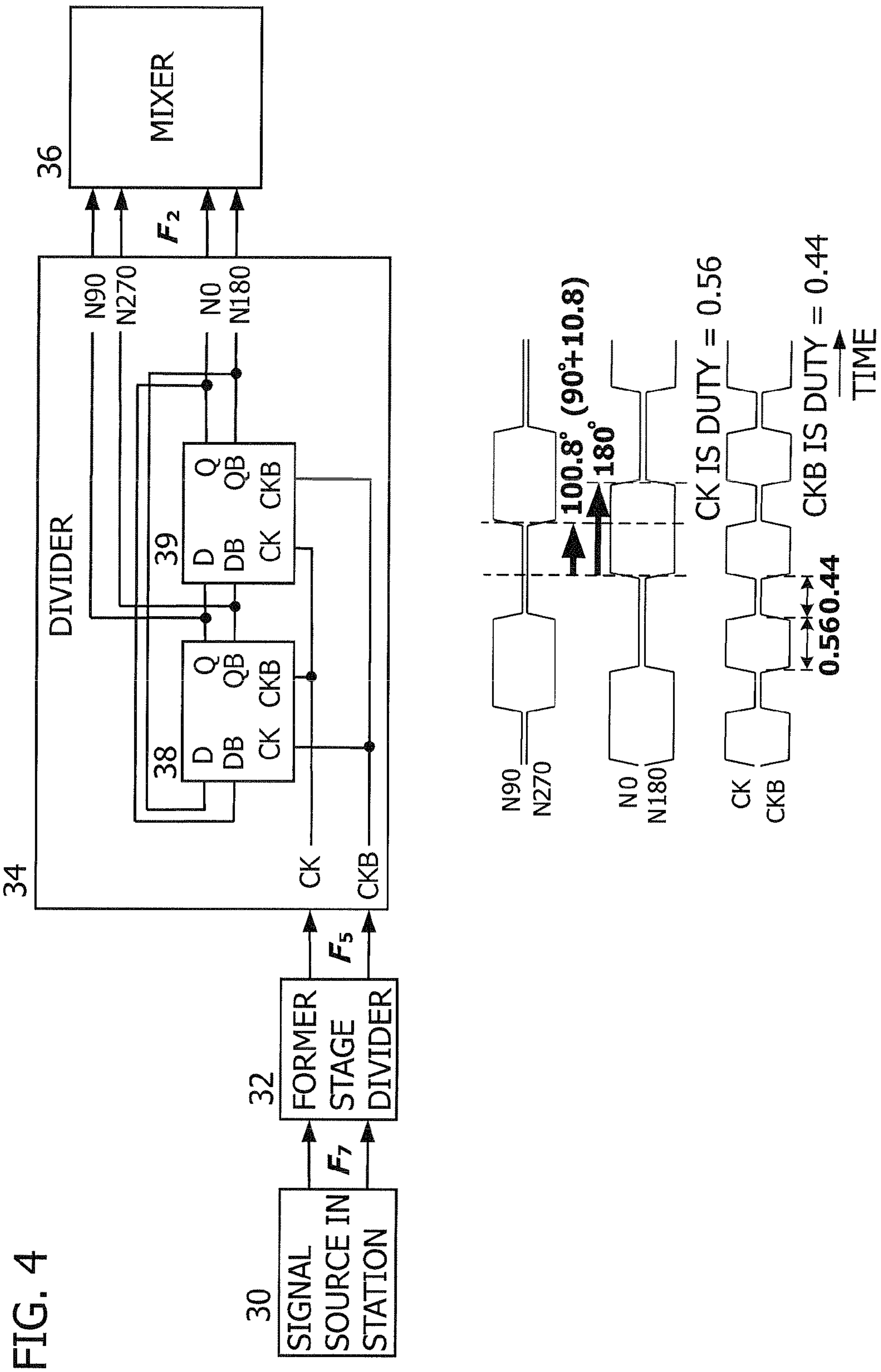
FIG. 4 illustrates a local signal generation circuit for generating a local signal of which phase difference is shifted from 90°.

FIG. 4 illustrates a local signal generation circuit for generating a local signal of which phase difference is shifted from 90°. The configuration of the local signal generation circuit is the same as FIG. 3. The difference from FIG. 3 is that the duty ratio of the differential input clocks CK and CKB generated by the former stage divider 32 is 0.56, and the H level period of the input clock CK is longer than the L level period. Accordingly, the phase difference of the output clocks (N0 and N180) and (N90 and N270) is 100.8, shifted from 90°. In this way, due to the subtle shift, 0.06, of the duty ratio of the input clocks CK and CKB from 0.5, the phase difference of the output clocks shifts 10.8° from 90°.

It is rare that the duty ratio of the input clocks CK and CKB at frequency F5 to be input to the divider 34 becomes 0.5 perfectly due to the characteristic dispersions of the signal source 30 and the circuit elements of the former stage divider 32, and the delay characteristics in these circuits.

However if a phase difference greater or lesser than the ideal 90° is generated between the output clocks (N0 and N180) and (N90 and N270) of the divider 34, a phase adjustment circuit for adjusting the phases of these output clocks is disposed in the mixer 36, then an ideal 90° phase difference is implemented.

Figure 5:
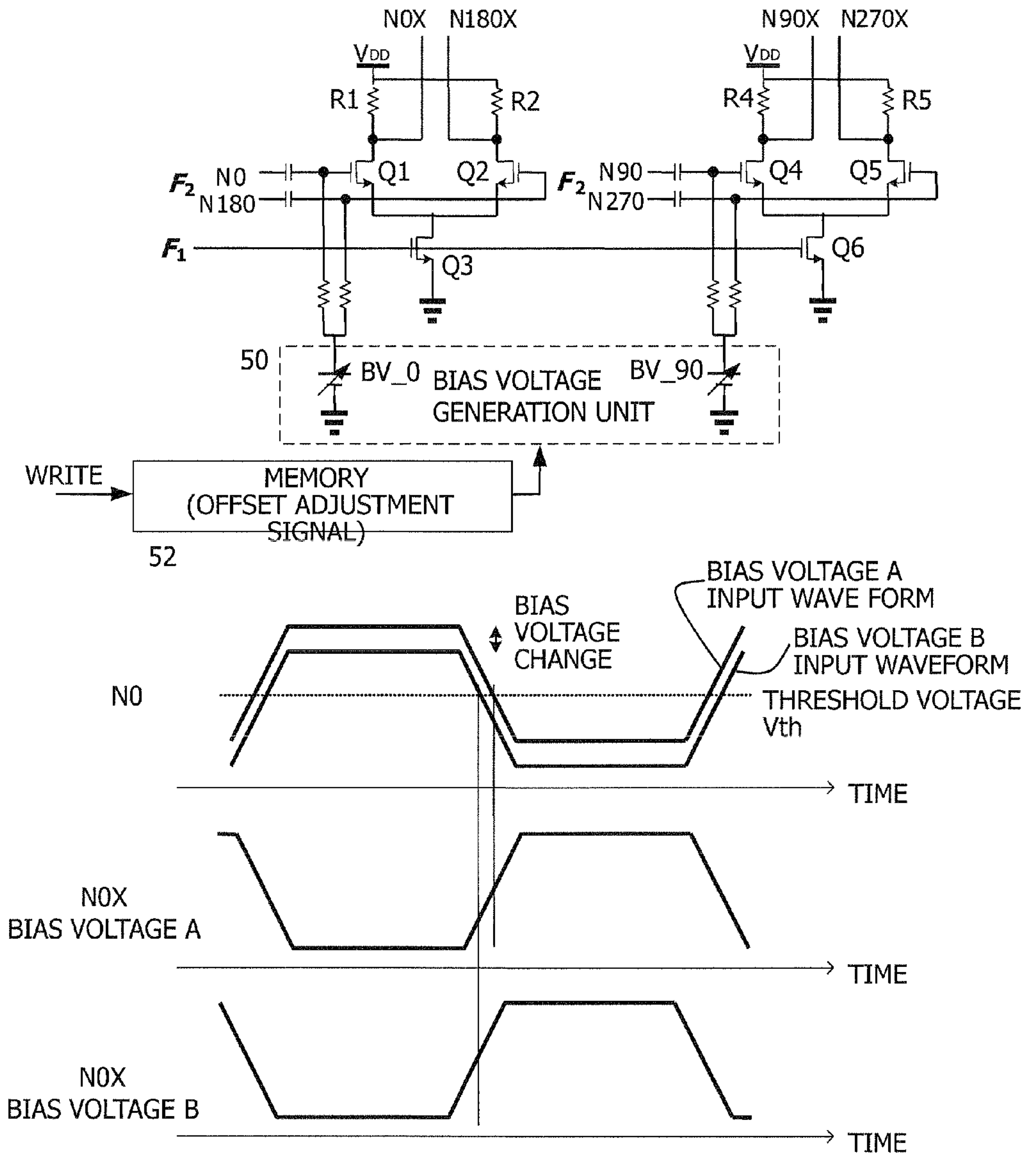
FIG. 5 illustrates a phase adjustment circuit.

FIG. 5 illustrates a phase adjustment circuit. The phase adjustment circuit has a first phase adjustment circuit having transistors Q1, Q2 and Q3, resistors R1 and R2, and a bias voltage BV_0, and a second phase adjustment circuit having transistors Q4, Q5 and Q6, resistors R4 and R5, and bias voltage BV_90, and a bias voltage generation unit 50 supplies bias voltage corresponding to an offset adjustment signal which is written to a memory 52 from the outside, to input terminals of the first and second phase adjustment circuits.

As FIG. 5 depicts, with respect to the threshold voltage Vth of the differential circuit constituted by Q1, Q2 and Q3 of the first phase adjustment circuit, a signal waveform of the input clock N0 in the case of a bias voltage A is higher than a signal waveform of the input clock N0 in the case of a bias voltage B, which is lower than the bias voltage A. Accordingly, the rise edge of the output clock NOX due to the change of the transistor Q1 from ON to OFF delays in the case of the bias voltage A than in the case of the bias voltage B. In other words, the phase of the output clock is different according to the level of the bias voltage. This means that the phase difference of the output clocks (NOX and N180X) and (N90X and N270X) are finely adjusted by adjusting the bias voltage.

Thus according to the phase adjustment circuit depicted in FIG. 5, the phase difference of the output clocks (NOX and N180X) and (N90 and N270X) of the phase adjustment circuit is finely adjusted by adjusting the bias voltages BV_0 and BV_90 using memory set values. Consequently, the phase difference of the local clocks is adjusted to 90° with high precision by disposing this phase adjustment circuit in the input stage of the mixer 36 in FIG. 3 and FIG. 4.

However, if the duty ratio of the output signals F5(0) and F5(180) of the former stage divider 32 in FIG. 3 and FIG. 4, that is the duty ratio of the clocks CK and CKB, randomly changes, it is difficult to maintain the phase difference between the output clocks (N0 and N180) and (N90 and N270) due to the shift of the duty ratio at an ideal 90°, even if the above mentioned phase adjustment circuit is used. For example, a case of the H level period of the clocks CK and CKB being longer than the L level period and a case of the H level period of the clocks CK and CKB being shorter than the L level period may be generated at random. Such phenomena of the duty ratio changing at random is not desirable for a fixed phase adjustment method by setting the bias voltage in memory from the outside, as depicted in FIG. 5.

Figure 6:
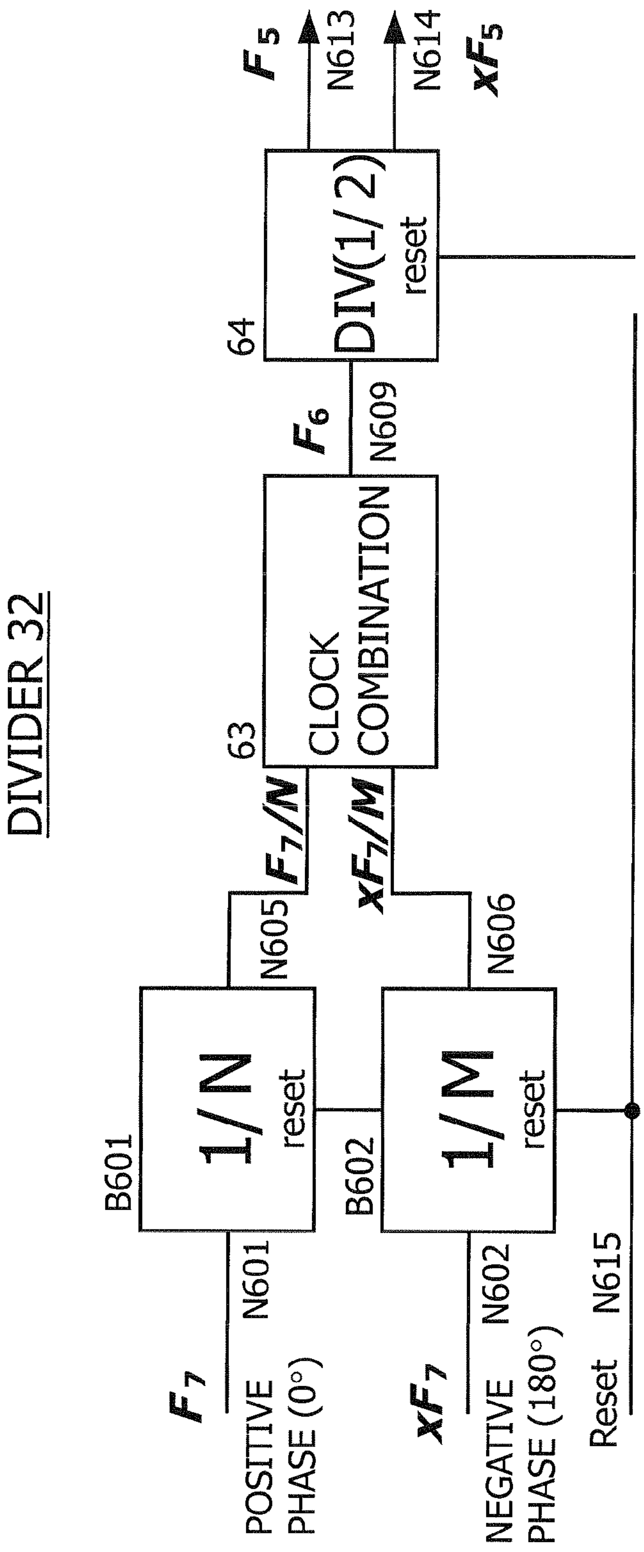
FIG. 6 illustrates the configuration of the former stage divider 32 in FIG. 3 and FIG. 4.

FIG. 6 illustrates the configuration of the former stage divider 32 in FIG. 3 and FIG. 4. The divider 32 generates the differential clocks N613 and N614 at the frequency F5 from the differential clocks N601 and N602 at frequency F7. The input clock N601 is a positive phase (0°) clock and the input clock N602 is a negative phase (180°) clock. In the same manner, the output clock N613 is a positive phase (0°) clock and the output clock N614 is a negative phase (180°) clock.

The divider 32 has a dividing circuit B601 which divides the frequency of the input clock N601 to 1/N, and a dividing circuit 8602 which divides the frequency of the input clock N602 to 1/M. These dividing circuits B601 and B602 are counters, for example. It is preferable that the dividing ratios N and M of the counters are the same. However the dividing ratios N and M of the counters need not be the same. In this case, the control disclosed in the above mentioned Japanese Patent Application Laid-Open No. 2005-333567 is applied so that when one counter finishes counting, the reset of the other counter is cleared, and starts the counting operation. Thereby the generation of the clock pulse N605 generated by one counter B601 dividing the input clock to 1/N and the generation of the clock pulse N606 generated by the other counter B602 dividing the input clock to 1/M are executed alternately.

The divider 32 also has a clock combining circuit 63 for combining the clocks N605 and N606 which are output by the dividing circuits B601 and B602. The clock combining circuit 63 is an OR circuit which determines the OR of the clocks N605 and N606, a NAND circuit which inverts the clocks N605 and N606 and determines a NAND, or a selection circuit which alternately selects a pulse of the clock N605 and a pulse of the clock N606. A dividing circuit 64 in the output stage is an output dividing circuit which divides the frequency of the combined clock N609 in half, and outputs the differential output clocks N613 and N614. A reset signal N615 can be supplied to the dividing circuits B601, B602 and 64, and when the reset signal N615 becomes H level, the operation of each dividing circuit is reset.

Figure 7A:
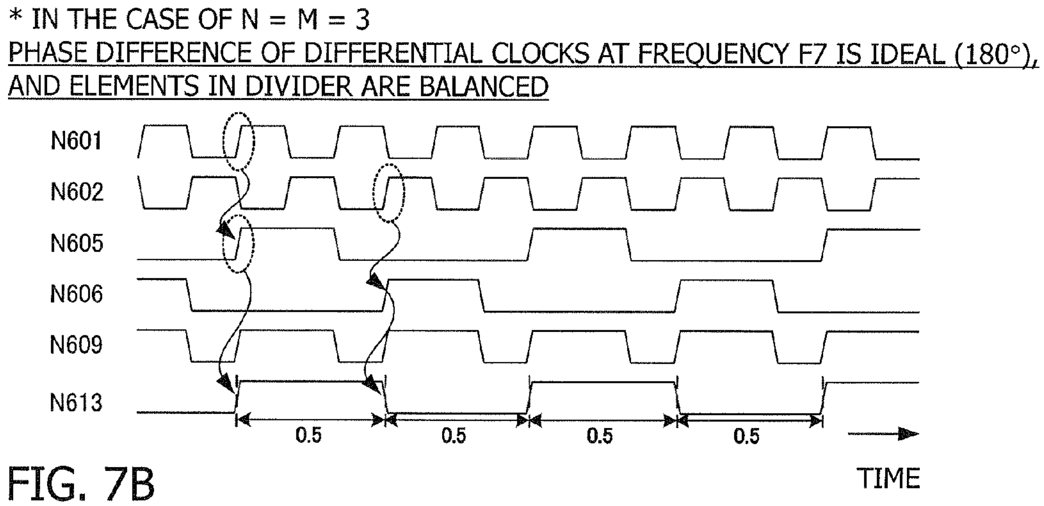
FIG. 7A, FIG. 7B and FIG. 7C depict waveform diagrams depicting the operation of the divider 32 in FIG. 6.
Figure 7B:
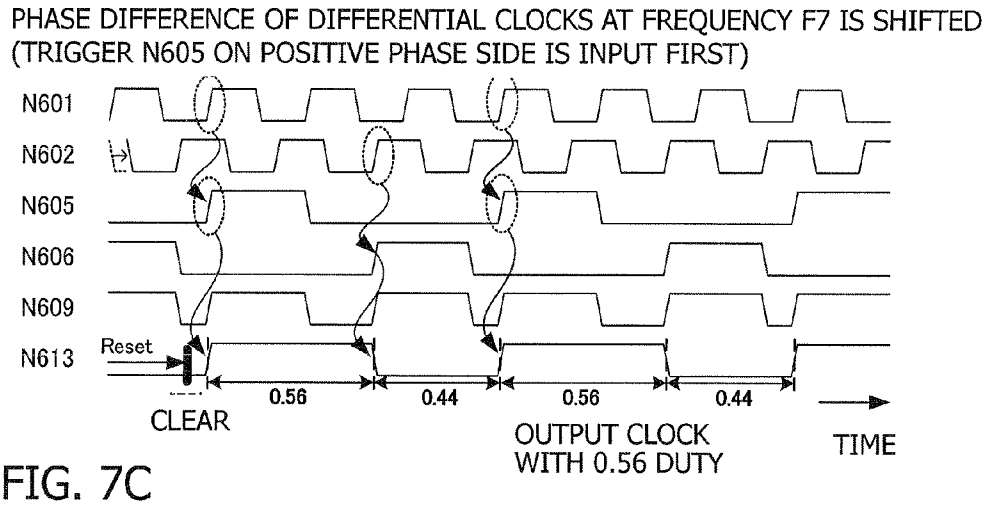
Figure 7C:
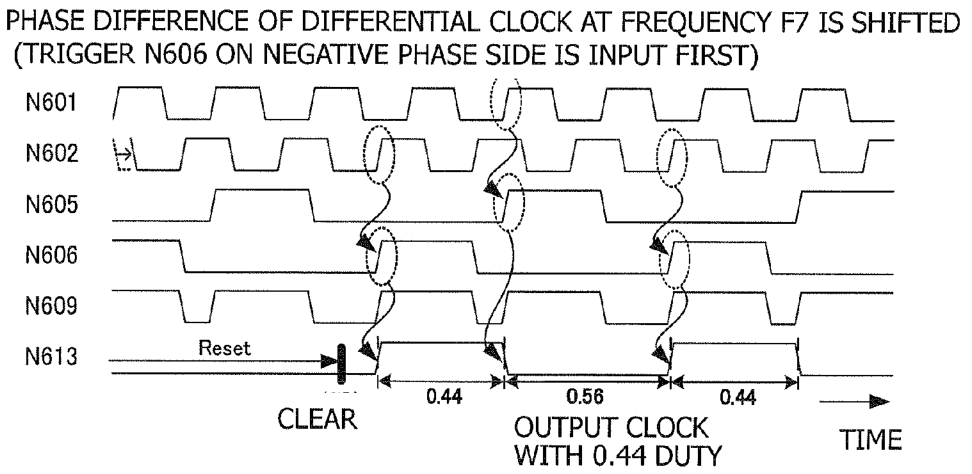

FIG. 7A, FIG. 7B and FIG. 7C depict waveform diagrams depicting the operation of the divider 32 in FIG. 6. In FIG. 7A, FIG. 7B and FIG. 7C, a case when the dividing ratios N and M of the dividing circuits B601 and B602 of the divider 32 are N=M=3 is considered. FIG. 7A is a waveform diagram when the phase difference of the input differential clocks N601 and N602 at frequency F7 is an ideal 180°, and the circuit elements in the divider are balanced. The dividing circuits N601 and N602 generates clocks N605 and N606 which have rise edges synchronizing with the rise edges of the input clocks N601 and N602, and have a clock cycle which is three cycles of the input clocks. The clock combining circuit 63 combines these clocks N605 and N606, and generates a clock N609 which has double pulse edges of the rise edges and the fall edges of the clocks N605 and N606.

Then the output dividing circuit 64 generates the ½-divided output clocks N613 and N614 which alternately repeats rise and fall, synchronizing with the rise edge of the clock N609. In other words, as FIG. 7A depicts, the rise edge of the output clock N613 is generated responding to the rise edge of the clock N605, and the fall edge of the output clock N613 is generated responding to the rise edge of the clock N606. This means that the clocks N605 and N606 are clocks to be triggers of the pulse edge of the output clock N613. Therefore the clocks N605 and N606 are also called trigger clocks hereinbelow. The contents disclosed by JP 2005-333567 is now incorporated in the present specification.

In the example in FIG. 7A, the phase difference of the input clocks N601 and N602 is an ideal 180°, hence the duty ratio of the output pulse N613 having pulse edges corresponding to these rise edges of N601 and N602 is an ideal 0.5.

FIG. 7B is a waveform diagram in a case when the phase difference of the input differential clocks N601 and N602 at frequency F7 is shifted from 180°, and a trigger pulse N605 having a positive phase is input first after reset is cleared. The phase of the input clock N602 delays more than 180° from the phase of N601. Therefore the phase difference of the trigger clocks N605 and N606 is longer than N605–N606 than in N606–N605. Since the trigger pulse N605 having a positive phase is input first after the reset signal N615 is cleared, the H level period (period of N605–N606) of the output clock N613 becomes longer than the L level period (period of N606–N605). In the case of the example in FIG. 7B, the duty ratio is 0.56.

FIG. 7C, on the other hand, is a waveform diagram in a case when the phase difference of the input differential clocks N601 and N602 at frequency F7 is shifted from 180°, and a trigger pulse N606 having a negative phase is input first after reset is cleared. In the same manner as in FIG. 7B, the phase of the input clock N602 delays more than 180° from the phase of N601. Therefore the phase difference of the trigger clocks N605 and N606 is such that N605–N606 is longer than N606–N605. Since the trigger pulse N606 having a negative phase is input first after the reset signal N615 is cleared, the H level period (period of N606–N605) of the output clock N613 becomes shorter than the L level period (period of N605–N606) thereof. In the case of the example in FIG. 7C, the duty ratio is 0.44.

As FIG. 7B and FIG. 7C depict, if the phase difference of the input differential clocks N601 and N602 is shifted from 180° in the divider 32 in FIG. 6, the duty ratio of the output clocks N613 and N614 after startup becomes 0.56 or 0.44 depending on the timing when the reset signal N615 is cleared. This reset signal clear timing is a reset clear signal which is supplied from a power ON reset circuit via a signal line, and the timing thereof is uncertain.

Figure 8:
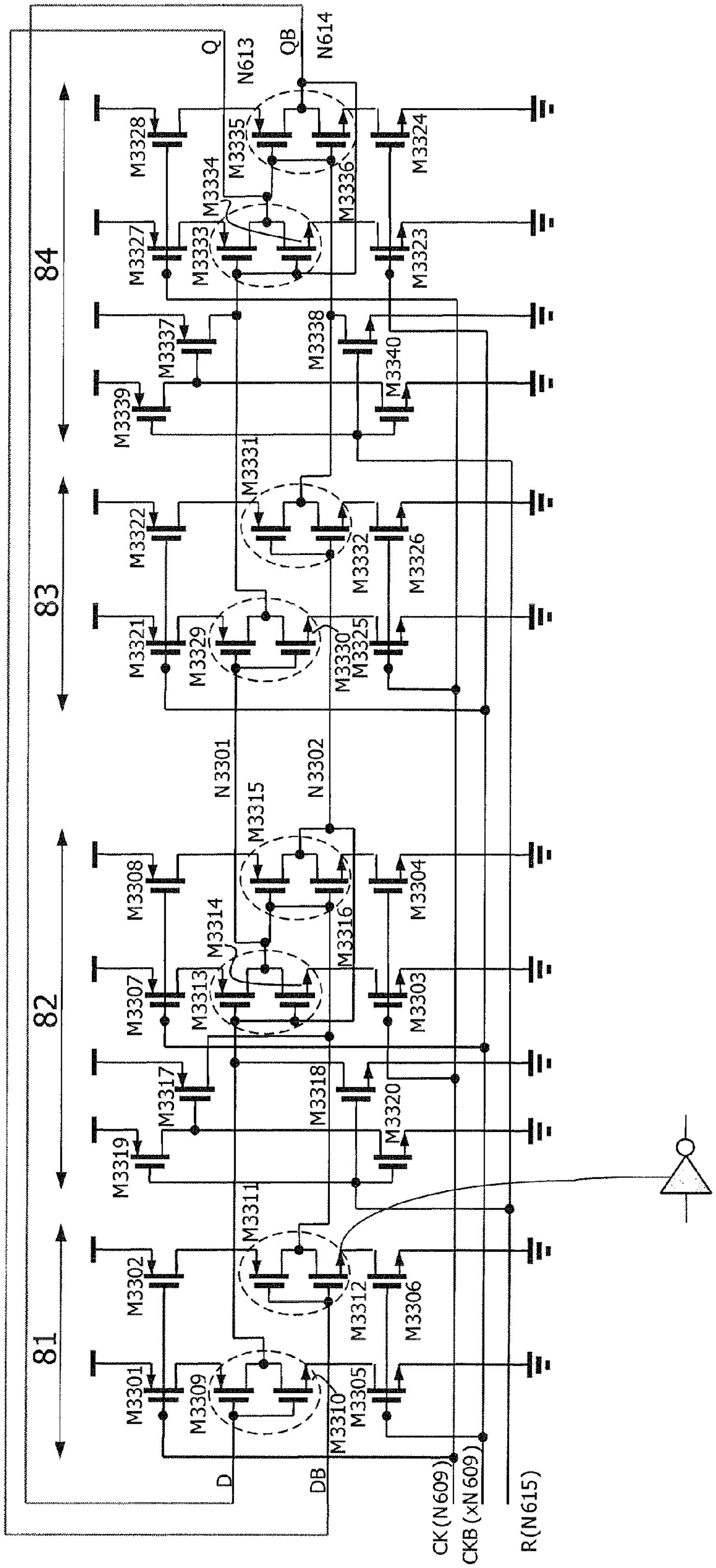
FIG. 8 illustrates a circuit example of the output dividing circuit 64 of the divider 32.

FIG. 8 illustrates a circuit example of the output dividing circuit 64 of the divider 32. The output dividing circuit 64 is a circuit for dividing the frequency of the differential clocks N609 and xN609 in half, and the differential output clocks Q and QB correspond to N613 and N614. The output dividing circuits 64 has a former stage latch constituted by an input circuit 81 and a holding circuit 82, and a latter stage latch constituted by an input circuit 83 and a holding circuit 84. The D flip-flop constituted by these two stages of latches is the same as the divider 34 depicted in FIG. 4.

A circuit enclosed by a broken line ellipse in FIG. 8 is an inverter respectively, and a pair of control transistors, such as M3301 and M3305, for enabling or disabling these invertors, are disposed on the power supply side and the ground side of the invertors respectively. The control transistors M3301, M3305 or the like of the input circuits 81 and 83 are controlled by the input clocks N609 and xN609, the output control transistors M3317, M3318 or the like used for resetting of the holding circuits 82 and 84 are controlled by the reset clock N615, and the control transistors M3307, M3303 or the like of the holding unit of the holding circuits 82 and 84 are controlled by the input clocks N609 and xN609.

Figure 9:
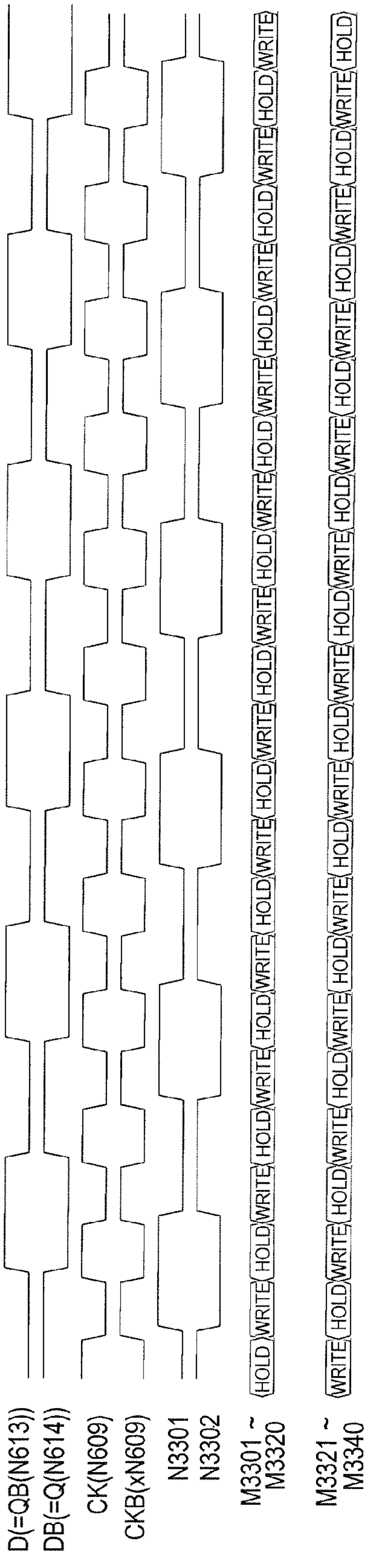
FIG. 9 depicts waveform diagrams of the output dividing circuit 64.

FIG. 9 depicts waveform diagrams of the output dividing circuit 64. In the reset state, the reset signal N615 is in the H level and the transistors M3337 and M3338 are both ON, hence the output clocks N613 and N614, which are connected to the drain terminals of these transistors, are L level and H level respectively. The outputs N3301 and N3302 of the holding circuit 82 in the former stage are H level and L level respectively. When the reset state is cleared, the reset signal N615 becomes the L level, and the input circuits 81 and 83, and the holding circuits 82 and 84 are alternately controlled by the input clocks N609 and xN609, and operate as ½ dividing circuits. At the rise edge of the fist input clock N609 after reset is cleared, the latter stage input circuit 83 inputs H level and L level for the outputs N3301 and N3302 of the former stage holding circuit 82, whereby the output clocks N613 and N614 change from L level to H level, and from H level to L level respectively. In this way, responding to the rise edge of the first input clock N609, the output clock N613 rises from L level to H level.

By the description of FIG. 8 and FIG. 9, it became clearer that the duty ratio of the output clock N613 becomes two states, depending on whether the first trigger clock, after reset is cleared in FIG. 7B and FIG. 7C, is N605 or N606.

The divider 34 in FIG. 4 also has the circuit configuration and operation waveform the same as FIG. 8 and FIG. 9.

As mentioned above, it is not desirable for the phase adjustment circuit that the duty ratio of the output clock F5 of the former stage divider 32 in FIG. 3 and FIG. 4 accidently takes two states. Therefore in the divider 32 according to the present embodiment hereinbelow, the duty ratio of the output clock can be corrected to either one of the two states.

First Embodiment

Figure 10:
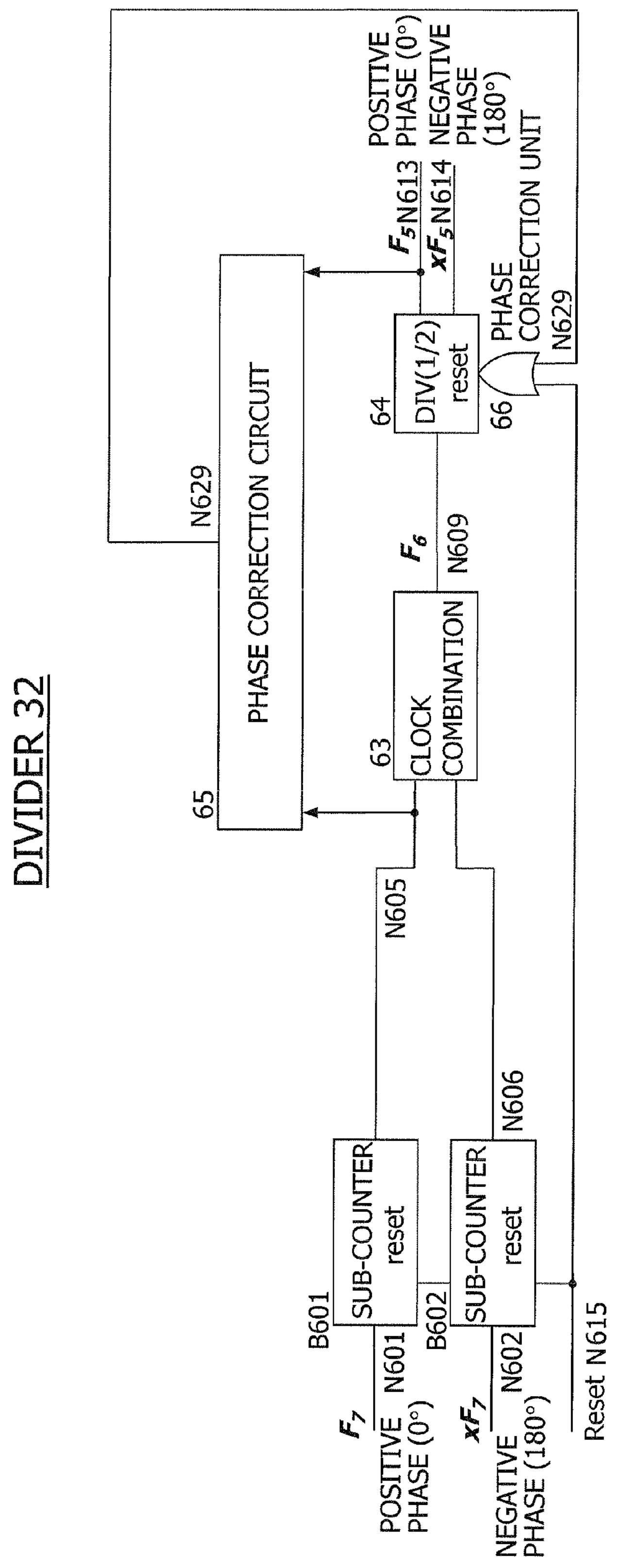
FIG. 10 is a block diagram of a divider according to a first embodiment.

FIG. 10 is a block diagram of a divider according to a first embodiment. In the same manner as the divider 32 in FIG. 6, this divider has sub-counters B601 and B602 which divide frequency to 1/N and 1/M, a clock combining circuit 63 for combining a positive phase trigger clock N605 and a negative phase trigger clock N606 which are output by the sub-counters, and an output dividing circuit 64 which divides the frequency of the combined clock N609 in half. In other words, the output clock N613 on the positive phase side could take two states, a case of rising from L to H responding to the rise edge of the positive phase trigger clock N605, and a case of rising from L to H responding to the rise edge of the negative phase trigger clock N606. The output clock N614 on the negative phase side performs an operation the opposite of this operation. These two states are generated depending on whether the positive phase trigger clock N605 is generated first or the negative phase trigger clock N606 is generated first after the reset signal N615 is cleared.

Therefore the divider in FIG. 10 has a phase correction circuit 65 which detects, whether the positive phase clock N613 changes from L to H (phase 0°) or from H to L (phase 180°) after the timing of the pulse edge of the positive phase trigger clock N605, and outputs a phase correction signal N629 if the phase is not normal. This phase correction signal N629 is input to a phase correction unit constituted by an OR gate 66, so as to reset the output dividing circuit 64. Since the change of the output clock N613 is generated after the timing of the pulse edge of the positive phase trigger clock N605, the phase correction circuit 65 detects whether the output clock N613 is in L level or H level at the timing of the pulse edge of the positive phase trigger clock N605 by whether the phase is 0° or 180°. According to this detection result, the phase correction circuit 65 outputs the phase correction signal N629.

Figure 11:
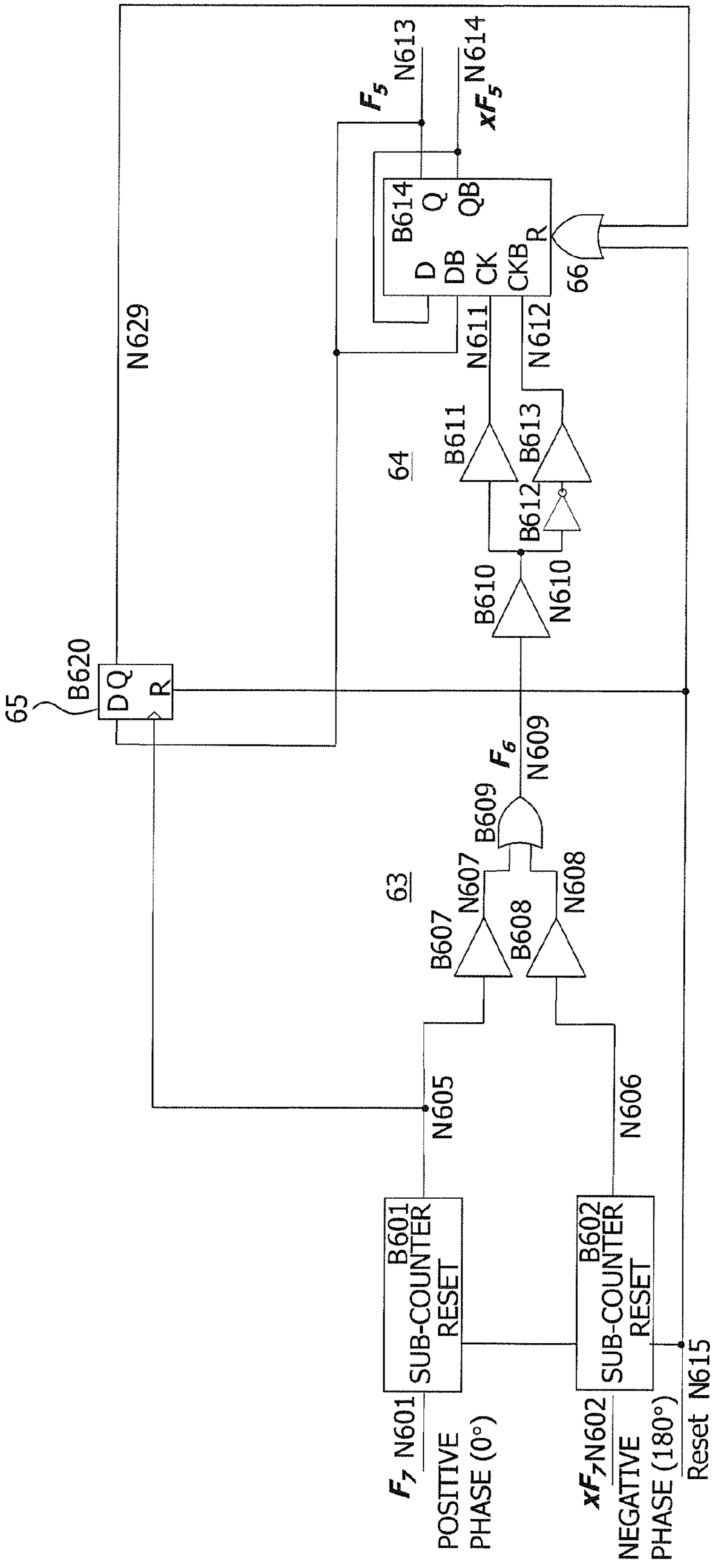
FIG. 11 is a circuit diagram of the divider according to the first embodiment.

FIG. 11 is a circuit diagram of the divider according to the first embodiment. The clock combining circuit 63 has a buffer B607 and a buffer B608 where a trigger clock N605 and a trigger clock N606 are input respectively, and an OR gate B609 which determines the OR of outputs N607 and N608 of the buffers. The OR gate B609 outputs a combined clock N609. The output dividing circuit 64 has: buffers B610, B611 and B613 and an inverter B612 which generate a positive phase clock N611 and a negative phase clock N612 of the clock N609, and a dividing circuit B614. The dividing circuit B614 has the circuit in FIG. 8, for example.

The phase correction circuit 65 has a D flip-flop B620 which latches the positive phase output clock N613 responding to the rise edge of the positive phase trigger clock N605. A signal which is output from a data output terminal Q of the D flip-flop B620 is a phase correction signal N629, which resets the divider B614 via the phase correction unit 66.

Figure 12A:
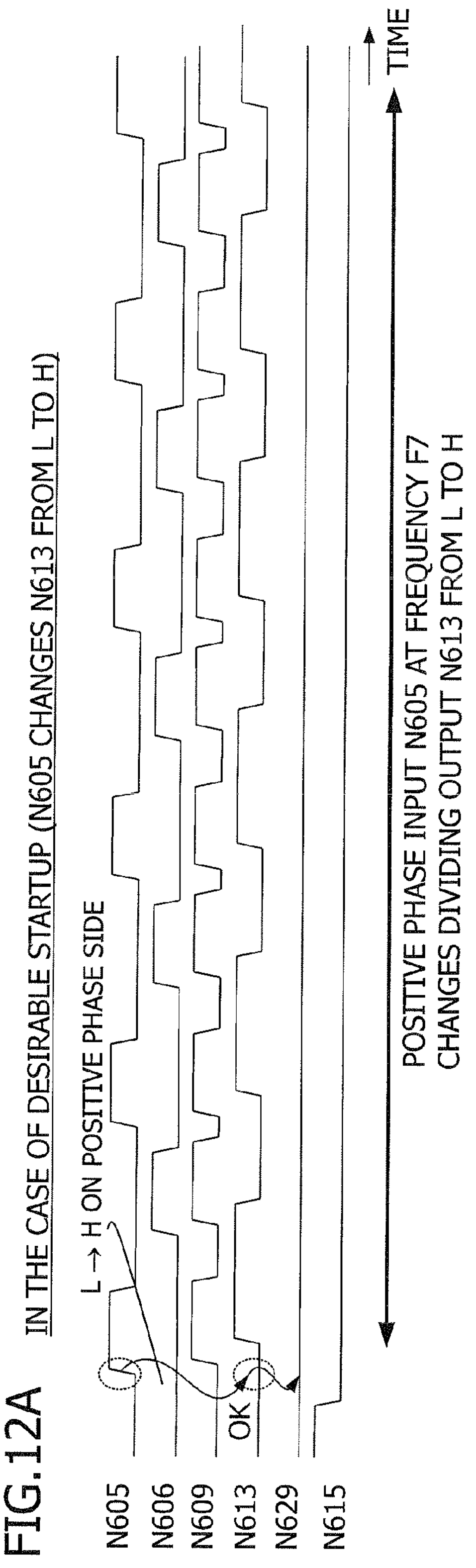
FIG. 12A and FIG. 12B are waveform diagrams of the divider according to the first embodiment.
Figure 12B:
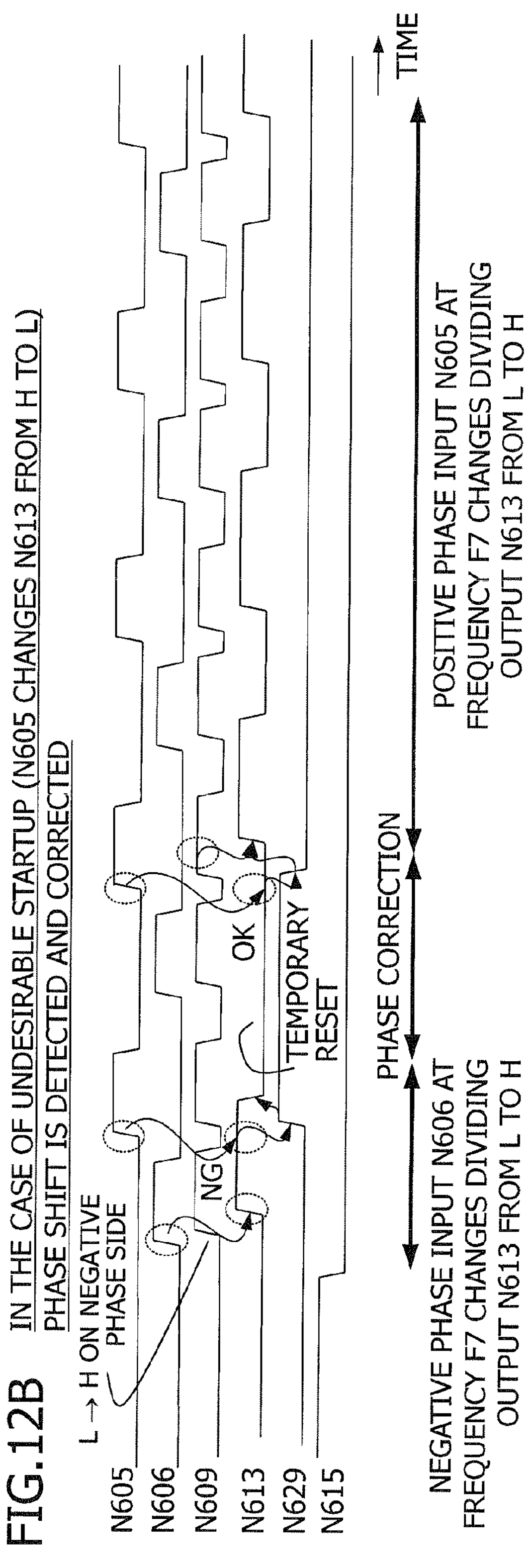

FIG. 12A and FIG. 12B are waveform diagrams of the divider according to the first embodiment. FIG. 12A depicts a case of a normal operation, and FIG. 12B depicts a case when an abnormal operation is detected and phase correction is performed.

In this divider, an operation where a positive phase output clock N613 rises from L to H level, due to the rise edge of a positive phase trigger clock N605, is regarded as a normal operation. Therefore, as FIG. 12A depicts, if the positive phase output clock N613 detected responding to the rise edge of the positive phase trigger clock N605 is in L level, the D flip-flop B620 regards this as a normal phase (OK), and keeps the phase correction signal N629 in L level.

On the other hand, if the positive phase output clock N613, which is detected responding to the rise edge of the positive phase trigger clock N605, is in H level, as depicted in FIG. 12B, the D flip-flop B620 regards this as an abnormal phase (NG), sets the phase correction signal N629 to H level, and resets the output divider B614. By the phase correction signal N629=H level, the output divider B614 is maintained in the reset state, and the positive phase output clock N613 is maintained in L level. This is as described in FIG. 8 and FIG. 9. Since the sub-counters B601 and B602 are not reset even while the output divider B614 is maintained in the reset state, the positive phase trigger pulse N605 and the negative phase trigger pulse N606 are successively generated. As a result, the positive phase output clock N613, which is detected responding to the rise edge of the next positive phase trigger pulse N605, becomes L level, and is regarded as a normal phase (OK), and the phase correction signal N629 is changed to L level to clear the reset state. Thereafter the divider 32 continues the dividing operation in a desired normal state.

Even if an abnormal dividing operation occurs due to noise or the like during normal dividing operation, the D flip-flop B620 of the phase correction circuit 65 detects the abnormal state, and reset the output divider B614 to return to the normal state, as described above.

In FIG. 11, the D flip-flop B620 of the phase correction circuit may detect the level of the negative phase output clock B614 responding to the negative phase trigger clock N606, and use the detection signal for the phase correction signal B620. The D flip-flop B620 of the phase correction circuit may detect the level of the negative phase output clock B614 responding to the positive phase trigger clock N605, invert the output terminal Q, and use the result for the phase correction signal B620. The D flip-flop B620 of the phase correction circuit may also detect the level of the positive phase output clock B613 responding to the negative phase trigger clock N606, inverts the output terminal Q, and use the result for the phase correction signal B620.

The normal dividing operation and the abnormal dividing operation may be reversed. What matters is that the divider 32 does not enter two dividing operation states at random.

Modification 1 of the First Embodiment

Figure 13:
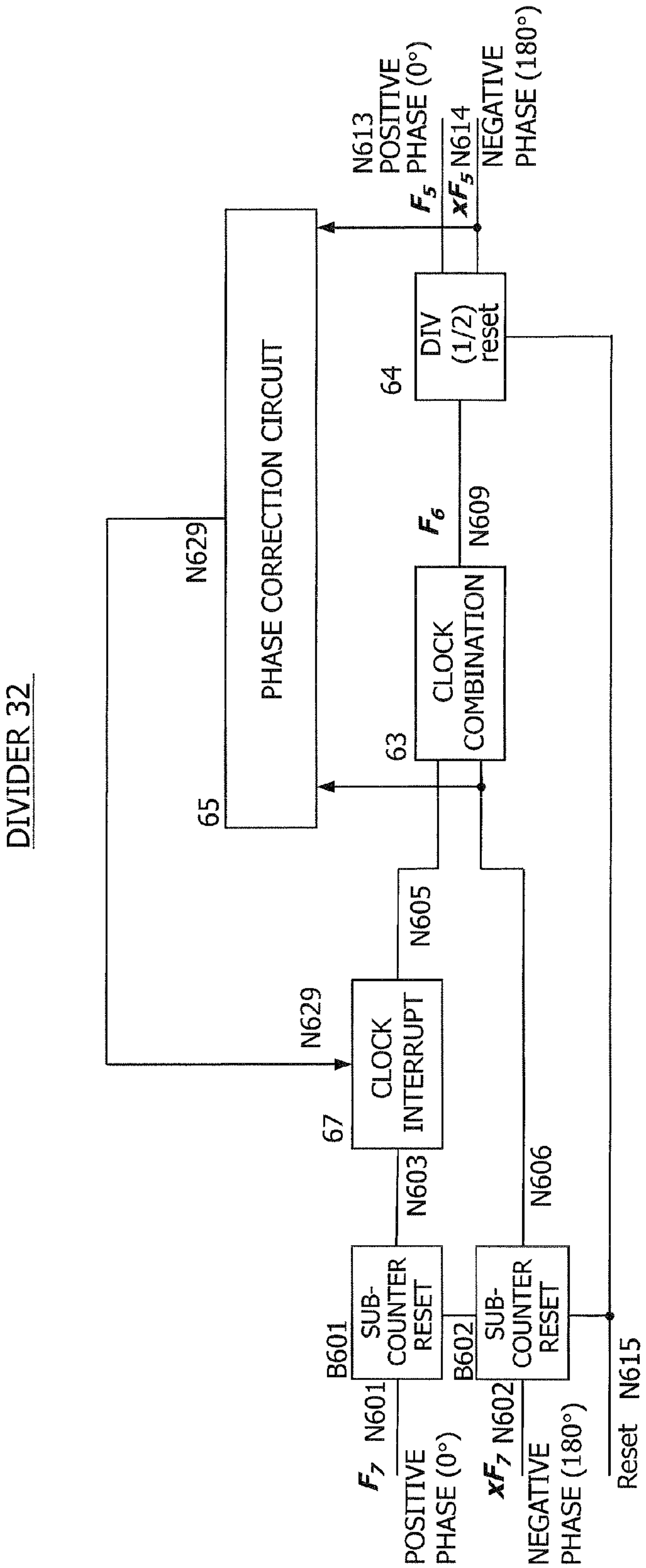
FIG. 13 is a block diagram of a modification 1 of the divider according to the first embodiment.

FIG. 13 is a block diagram of a modification 1 of the divider according to the first embodiment. In the same manner as the divider 32 in FIG. 10, this divider has sub-counters B601 and B602, a clock combining circuit 63 and an output dividing circuit 64. The divider also has a phase correction circuit 65 which detects whether the negative phase output clock N614 changes from L to H (phase 0°) or H to L (phase 180°) after the timing of a pulse edge of a negative phase trigger clock N606, and outputs a phase correction signal N629 in the case of the phase 180° which is not normal.

In this divider, unlike the divider in FIG. 10, the phase correction signal N629 is supplied to a clock interrupting circuit 67 which interrupts passing of the positive phase trigger clock N605. The clock interrupting circuit 67 disables passing of the positive phase trigger clock N605 while the phase correction signal N629 is in H level. By interruption of the positive phase trigger clock, the output divider is activated by the negative phase trigger clock N606 and the phase of the output clock is inverted. In other words, the phase is corrected.

Figure 14:
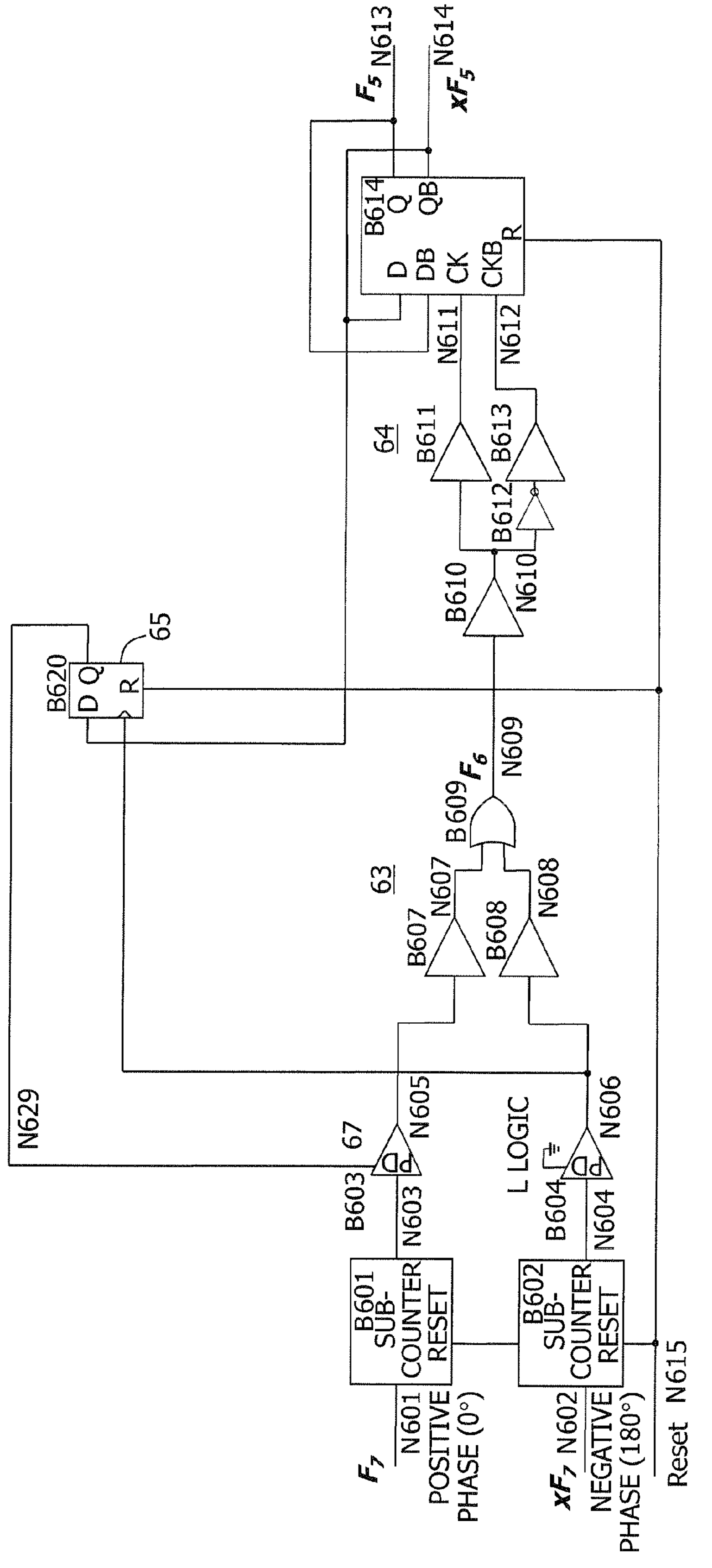
FIG. 14 is a circuit diagram of the modification 1 of the divider according to the first embodiment.

FIG. 14 is a circuit diagram of the modification 1 of the divider according to the first embodiment. A difference from the circuit diagram in FIG. 11 is that the D flip-flop B620 constituting the phase correction circuit 65 detects a phase (L level or H level) of the negative phase output clock N614 responding to the rise edge of a negative phase trigger clock N606, and if L level is detected, the D flip-flop B620 regards this as a normal state, and sets the phase correction signal N629 to L level, and if H level is detected, the D flip-flop B620 regards this as an abnormal state, and sets the phase correction signal N629 to H level. The divider also has a buffer B603 which interrupts or does not interrupt the passing of the positive phase trigger clock N605 responding to the control signal as a clock interrupting circuit 67. The divider also has a buffer B604 which always passes a clock, that is, which does not interrupt a clock, on the negative phase trigger clock N606 side, in order to maintain the delay balance. The buffer B603 allows a clock pass if the control signal is L, or interrupts the clock pass and forcibly sets the output to L level if the control signal is H.

Figure 15A:
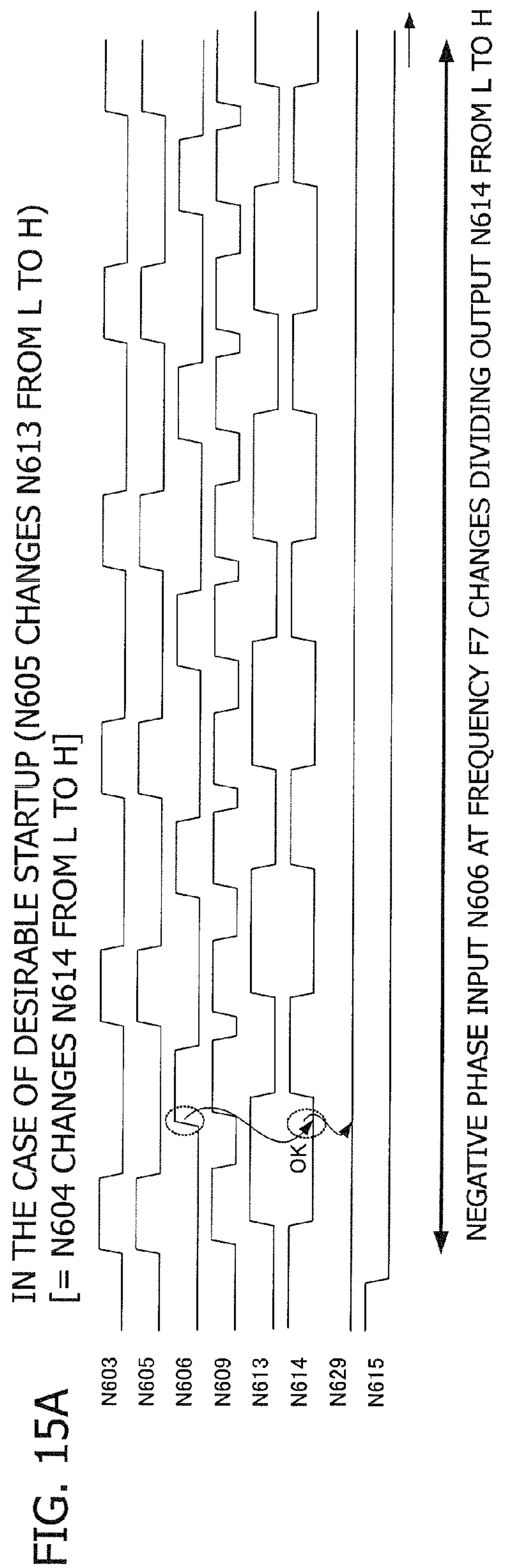
FIG. 15A and FIG. 15B are waveform diagrams of the modification 1 of the divider according to the first embodiment.
Figure 15B:
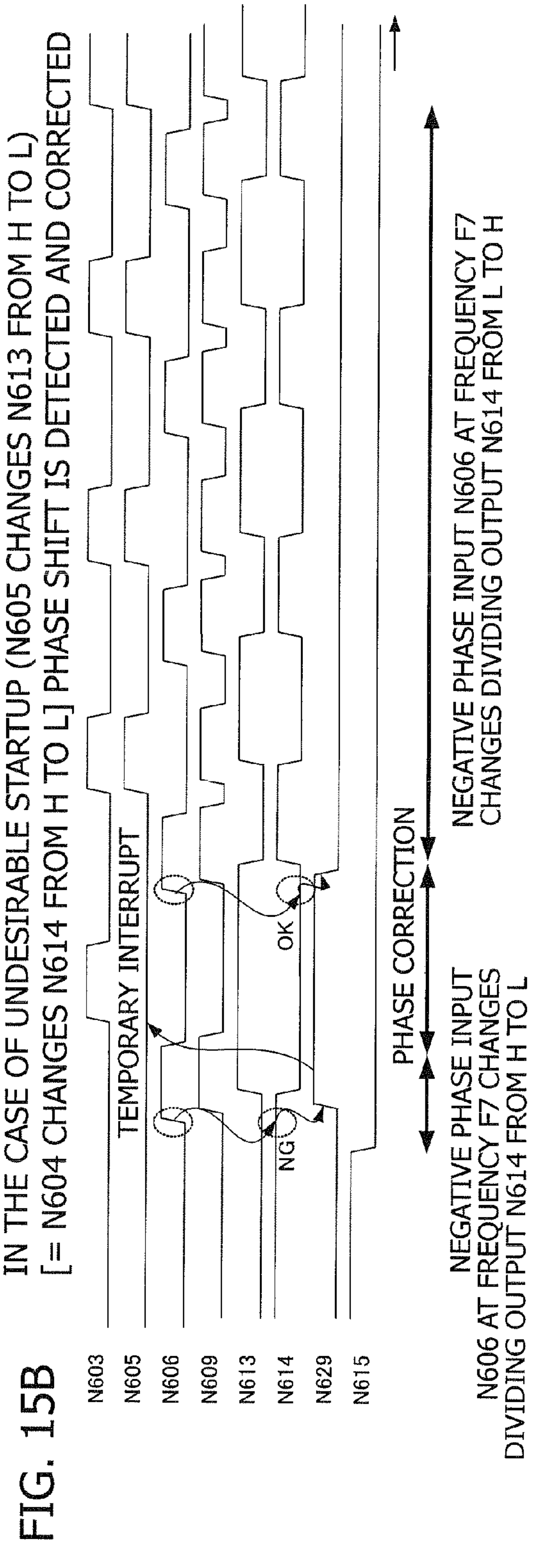

FIG. 15A and FIG. 15B are waveform diagrams of the modification 1 of the divider according to the first embodiment. FIG. 15A depicts a case of a normal operation, and FIG. 15B depicts a case when an abnormal operation is detected and phase correction is performed.

In this divider as well, an operation when a negative phase output clock N614 rises from L to H level, due to the rise edge of a negative phase trigger clock N606, is regarded as a normal operation. Therefore as FIG. 15A depicts, if the negative phase output clock N614, detected responding to the rise edge of the negative phase trigger clock N606, is in L level, the D flip-flop B620 regards this as a normal phase (OK), and maintains the phase correction signal N629 in L level.

On the other hand, as depicted in FIG. 15B, if the negative phase output clock N614, which is detected responding to the rise edge of the negative phase trigger clock N606, is in H level, the D flip-flop 8620 regards this as an abnormal phase (NG), sets the phase correction signal N629 to H level, and sets the clock interrupting circuit 67 to the interrupting state. Due to this, a pulse of the positive phase trigger clock N605 is temporarily interrupted since the phase correction signal N629 is H level. In other words, according to the phase of the negative phase output clock N614 detected responding to the negative phase trigger clock N606, the clock interrupting circuit 67 interrupts or not a pulse of the positive phase trigger clock N605 which arrives thereafter.

Then, when the D flip-flop B620 of the phase correction circuit 65 detects L level of the negative phase output clock N614 responding to the next negative phase trigger clock N606, the phase correction signal N629 is returned to L level. Thereafter, the divider 32 continues the dividing operation in a desired normal state.

Even if an abnormal dividing operation occurs due to noise or the like during normal dividing operation, the D flip-flop B620 of the phase correction circuit 65 will detect the abnormal state, and set the phase correction signal N629 to H level to set the clock interrupting circuit 67 to the interrupting state for returning to the normal state.

In FIG. 14, the D flip-flop B620 of the phase correction circuit may detect the level of the positive phase output clock B613 responding to the positive phase trigger clock N605, and use the detected signal for the phase correction signal N629. In this case, a clock interruption circuit is disposed on the negative phase trigger clock N606 side. The D flip-flop B620 of the phase correction circuit may detect the level of the negative phase output clock B614 responding to the positive phase trigger clock N605, invert the output terminal Q, and use the result for the phase correction signal N629. In this case as well, the clock interrupting circuit is disposed on the negative phase trigger clock N606 side. The D flip-flop B620 of the phase correction circuit may also detect the level of the positive phase output clock N613 responding to the negative phase trigger clock N606, invert the output terminal Q, and use the result for the phase correction signal N629. In this case, the clock interrupting circuit is disposed on the positive phase trigger clock N605 side.

The normal dividing operation and the abnormal dividing operation may be reversed. What matters is that the divider 32 does not enter two dividing operation states at random.

Modification 2 of the First Embodiment

Figure 16:
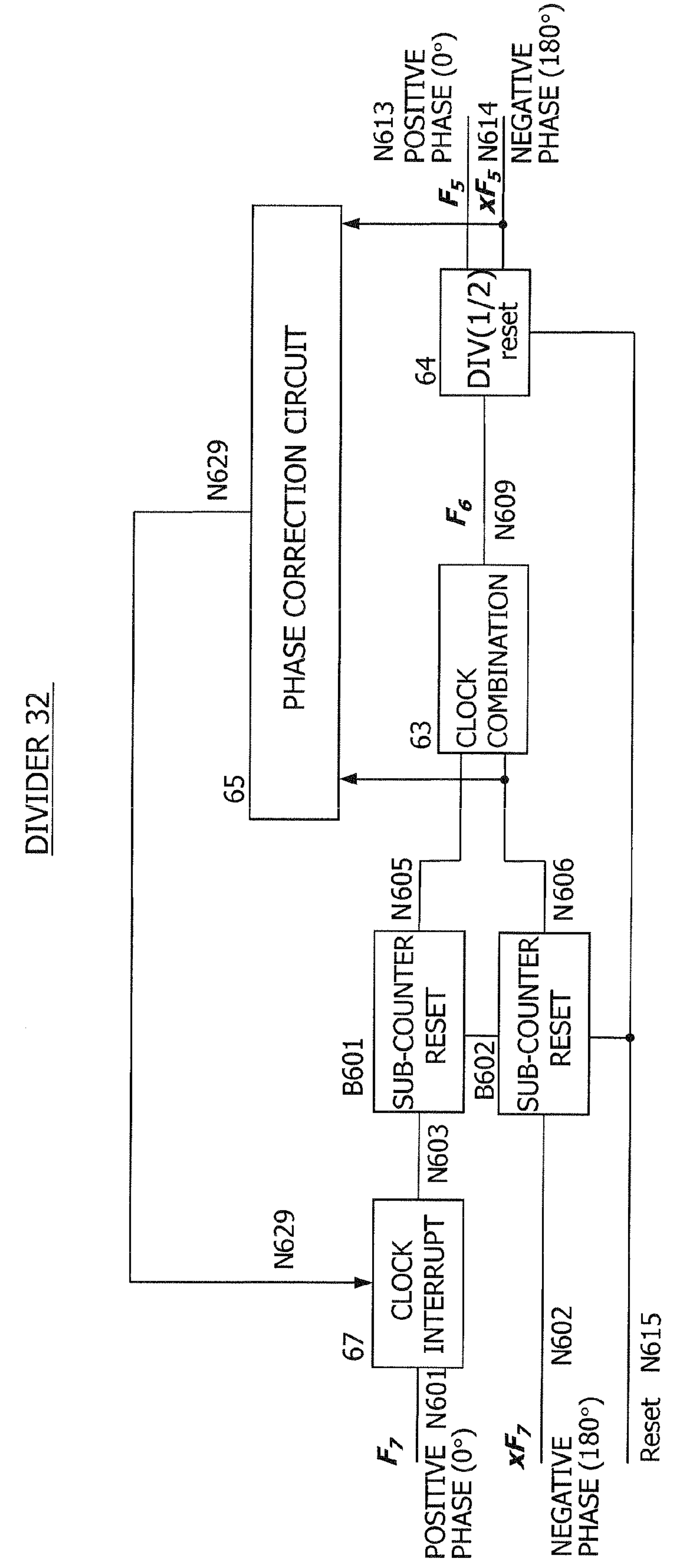
FIG. 16 is a block diagram of a modification 2 of the divider according to the first embodiment.

FIG. 16 is a block diagram of a modification 2 of the divider according to the first embodiment. A difference from the configuration of the modification 1 in FIG. 13 is that the clock interrupting circuit 67 is disposed in the former stage of the sub-counter B601. The operation is the same as the modification 1.

Figure 17:
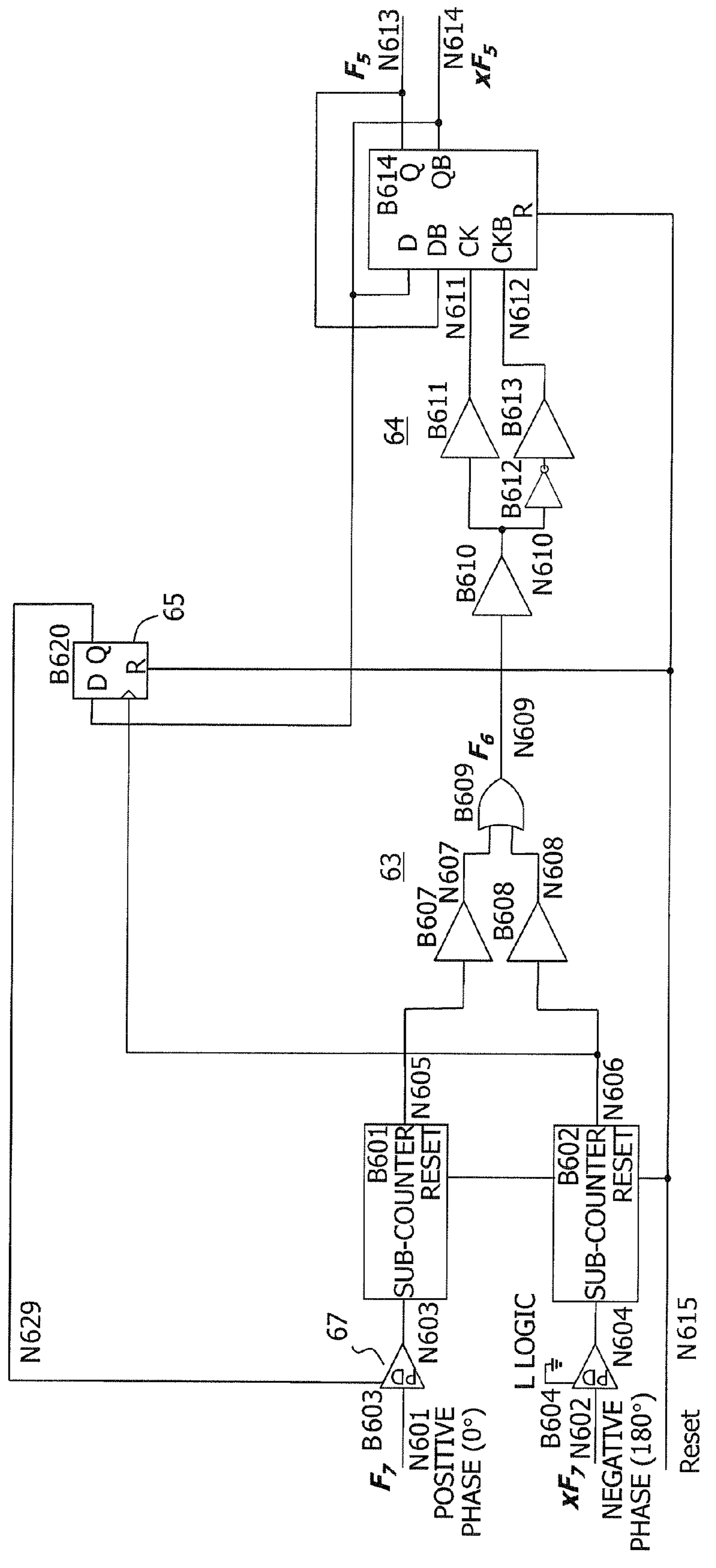
FIG. 17 is a circuit diagram of the modification 2 of the divider according to the first embodiment.

FIG. 17 is a circuit diagram of the modification 2 of the divider according to the first embodiment. A difference from the configuration of the modification 1 in FIG. 14 is that a buffer B603 with an interrupting function, of the clock interrupting circuit 67, is disposed in the former stage of the sub-counter B601.

Figure 18A:
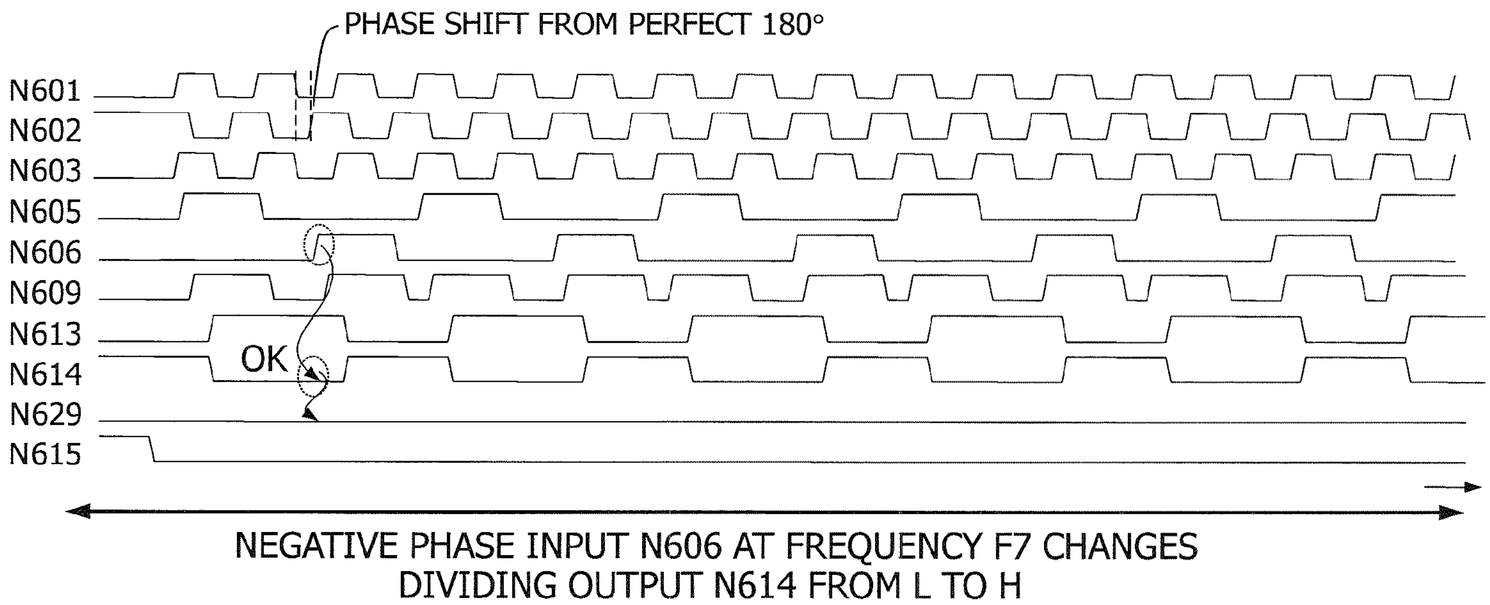
FIG. 18A and FIG. 18B are waveform diagrams of the modification 2 of the divider according to the first embodiment.
Figure 18B:
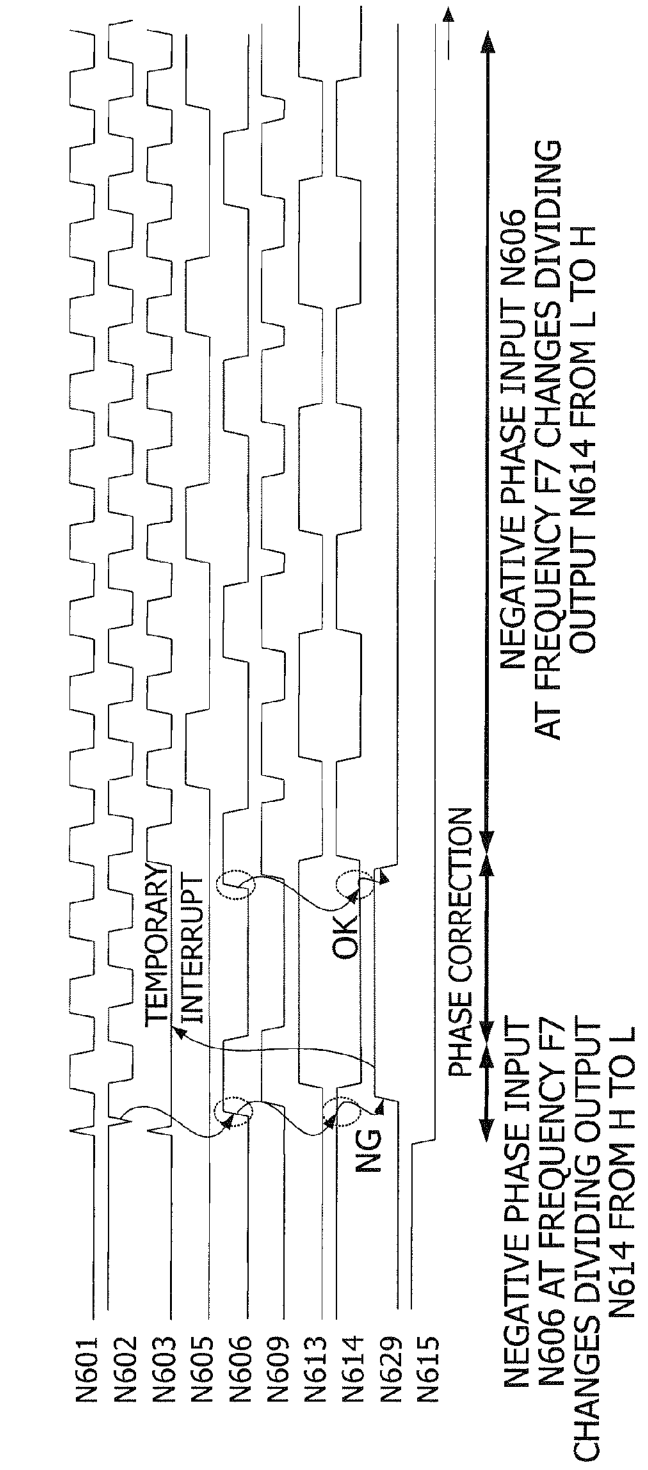

FIG. 18A and FIG. 18B are waveform diagrams of the modification 2 of the divider according to the first embodiment. In this example, the clock interruption circuit 67 interrupts the positive phase input clock N603. Therefore, the negative phase clock N614 maintains L level while the phase correction signal N629 is H level, and the D flip-flop B620 of the phase correction circuit 65 detects the L level of the negative phase output clock N614 at the next negative phase trigger clock N606, and sets the phase correction signal N629 L level. Thereafter the dividing operation is performed in the normal state.

In the modification 2, similarly to the modification 1, the trigger clock to be input to the clock terminal of the phase correction circuit 65, the output clock to be input to the input data terminal D, and a location where the clock interrupting circuit is disposed, can be changed.

In the case of the above mentioned divider 32 according to the first embodiment, no delay problems occur in a circuit if the operating frequency of the circuit is slow. However, if the operating speed becomes high, 10 GHz, for example, then the delay time in phase detection by the phase correction circuit and the delay time in phase correction become too large to be ignored, which may cause an operation error.

Figure 19:
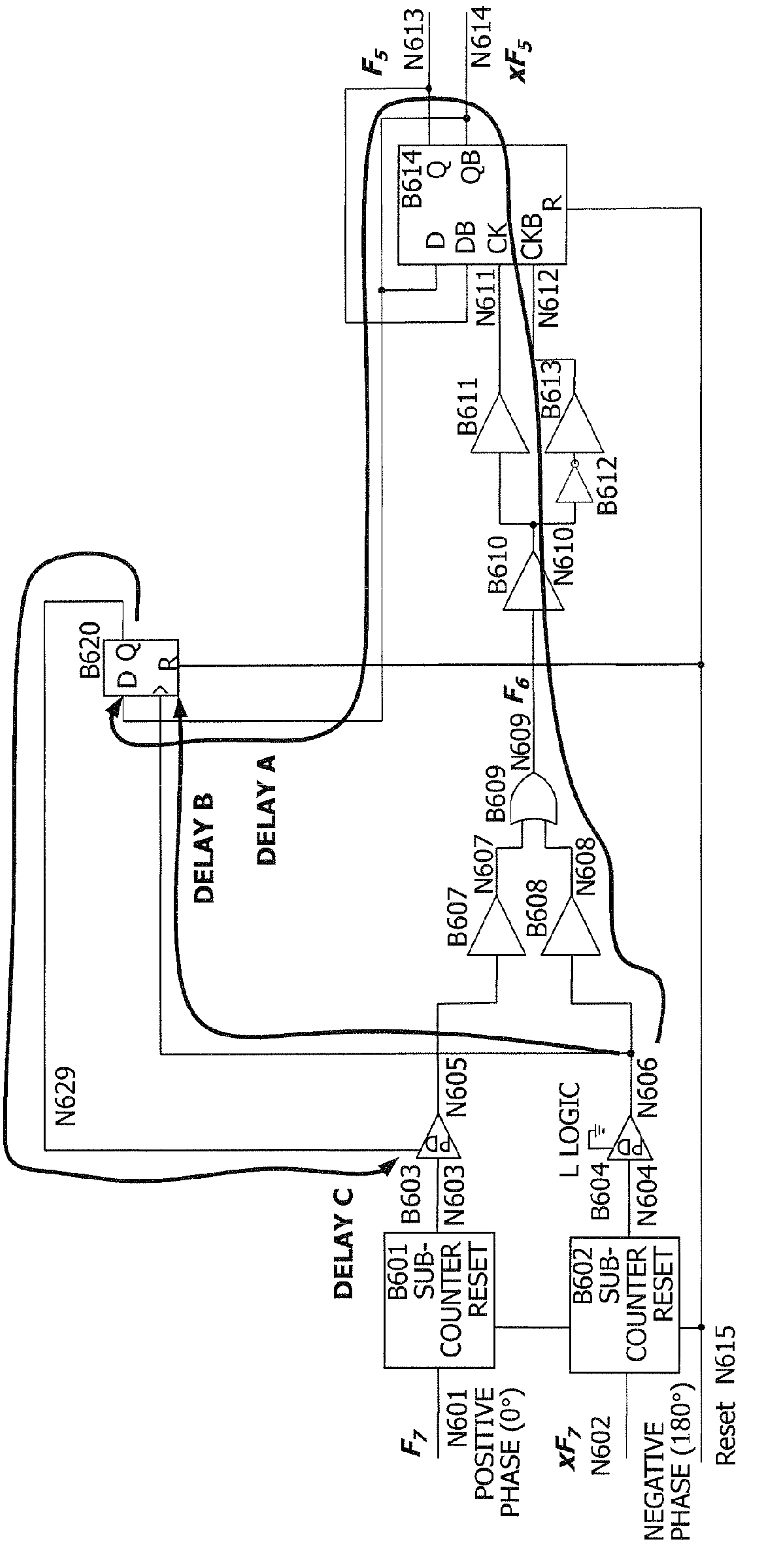
FIG. 19 illustrates the delay paths in the divider 32.

FIG. 19 illustrates the delay paths in the divider 32. This divider is an example having the circuit diagram in FIG. 14. First a delay A from the negative phase trigger clock N606 to the D flip-flop B620 for detecting a phase via the output divider B614, a delay B from the negative phase trigger clock N606 to the D flip-flop B620, and a delay C from the D flip-flop 8620 to the buffer B603 of the clock interrupting circuit, are considered.

A first problem is that when the difference of the delay A and the delay B becomes longer than around a half cycle of the output clock at frequency F5, the D flip-flop B620 for detecting a phase determines the logic of the output clock N614 of the output divider, generated by the negative phase trigger clock N606, to be opposite of actual logic in error.

Figures 20A, 20B:
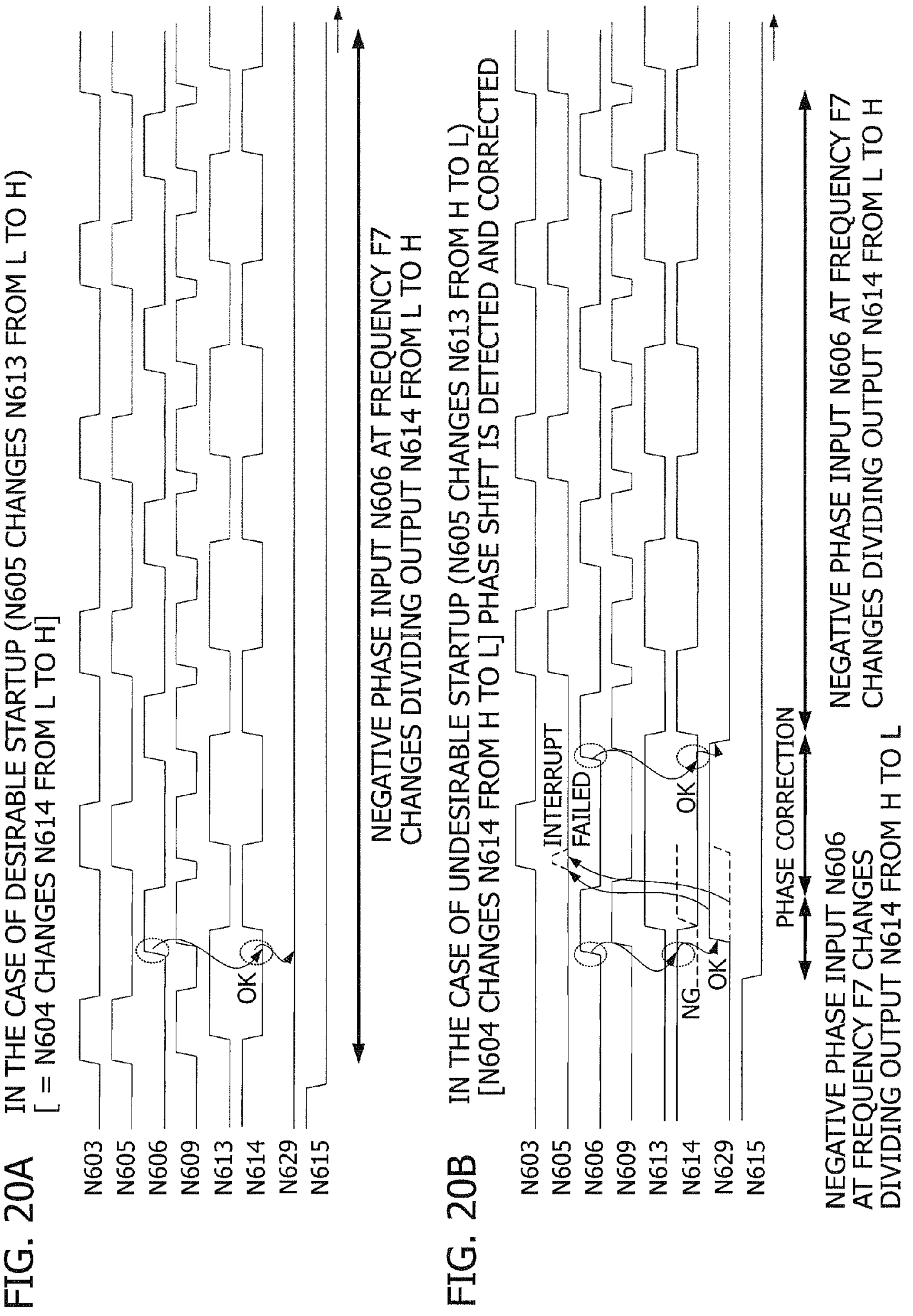
FIG. 20A and FIG. 20B are waveform diagrams depicting a delay time problem of the delay path of the divider 32.

FIG. 20A and FIG. 20B are waveform diagrams depicting a delay time problem of the delay path of the divider 32. FIG. 20A and FIG. 20B depict the delay path problem on the waveform diagram in FIG. 15. If the delay A increases in the abnormal operation state in FIG. 20B, the negative phase output clock N614 becomes as depicted by the broken line. In other words, the change of the negative phase output clock N614, caused by the positive phase trigger clock N605 immediately before the negative phase trigger clock N606, has not been completed. Therefore the D flip-flop B620 may detect L level of the negative phase output clock N614, and regard the state as normal in error.

A second problem is that when the sum of the delay B and the delay C becomes longer to be close to one cycle of the output clock at frequency F5, the phase correction signal N629 for controlling the interruption of the clock may reach the clock interrupting buffer B603 during the transmission of the positive phase trigger clock N605. In other words, if the phase correction signal N629 delays as indicated by the broken line in FIG. 20B, the phase correction signal N629 reaches the clock interrupting buffer B603 during the transmission of the positive phase trigger clock N605, and interruption fails. The output divider B614 does not temporarily stop the dividing operation at the rise edge of the transmitted positive phase trigger clock N605, and therefore phase correction is not executed.

The difference of the delay A and the delay B, and the sum of the delay B and the delay C, change depending on the operating environment (temperature and power supply voltage) of the integrated circuit, hence in some cases the phase correction would not be executed. A divider according to a second embodiment to be described below suppresses such detection errors and phase correction errors due to delays.

Second Embodiment

Figure 21:
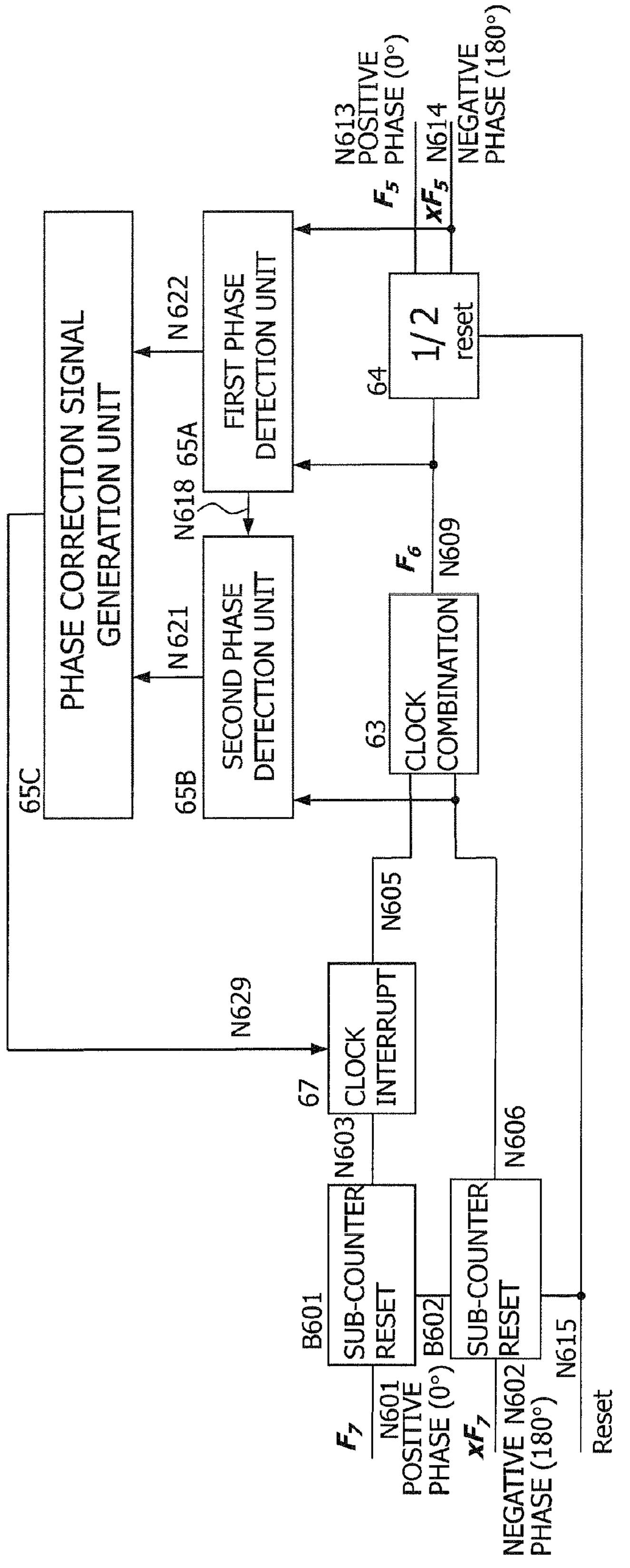
FIG. 21 is a block diagram of a divider according to a second embodiment.
Figure 22:
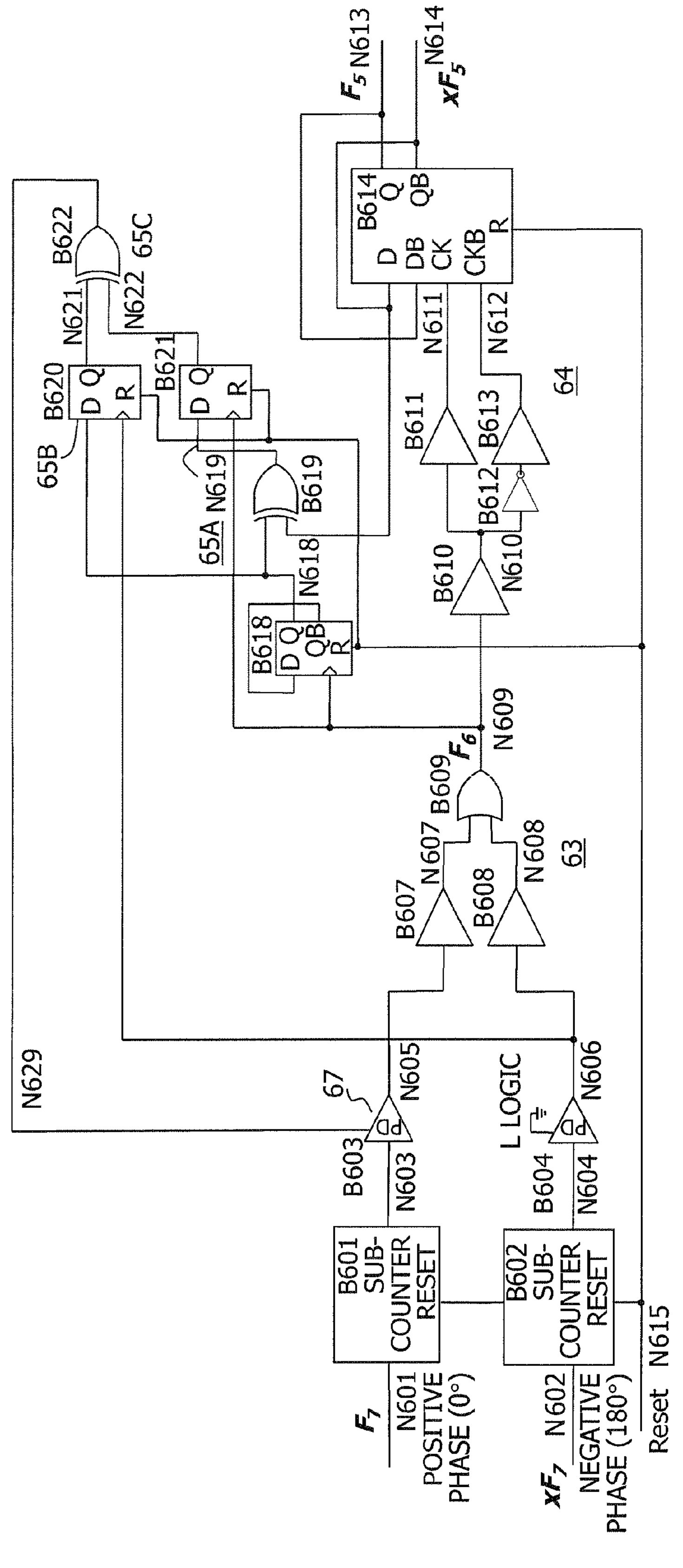
FIG. 22 is a circuit diagram of the divider according to the second embodiment.

FIG. 21 is a block diagram of a divider according to a second embodiment. FIG. 22 is a circuit diagram of the divider according to the second embodiment.

In the divider of the second embodiment, a phase correction circuit 65 has a first phase detection unit 65A, a second phase detection unit 65B and a phase correction signal generation unit 65C. For the phase detection, unlike the first embodiment, the phase of the negative phase output clock N614 of the output dividing circuit B614 is not directly detected by the negative phase trigger clock N606.

According to the second embodiment, a sub-divider B618 (divide by 2) is included in the first phase detection unit 65A. The first phase detection unit 65A has: an EOR gate B619 which detects whether the phase of an output clock N618 of the sub-divider 618, which performs dividing operation responding to a combining clock N609, and a phase of a negative phase output clock N614 of an output divider N614 are the same or opposite; and a D flip-flop B621 which latches the output of the EOR gate. In other words, the first phase detection unit 65A detects the phase relationship of the output clock N618 of the sub-divider B618 and the output clock N614 of the output divider B614.

The second phase detection unit 65B has a D flip-flop B620 for detecting a phase of the output clock N618 of the sub-divider 8618 responding to a negative phase trigger clock N606.

The phase correction signal generation unit 65C outputs a phase correction signal N629 according to the detection output N622 by the D flip-flop B621 of the first phase detection unit 65A and the detection output N621 by the D flip-flop B620 of the second phase detection unit 65B. Depending on the detection output N622 of the D flip-flop N621 of the first phase detection unit 65A (that is, whether the phase of the output clock N618 of the sub-divider B618 and the phase of the output clock N614 of the output divider B614 are the same or opposite), the EOR gate 8622 sets the phase correction signal N629 to H level (N629=H) where phase correction is executed by the clock interrupting, or to L level (N629=L) where the clock is not interrupted and phase correction is not executed.

The sub-divider B618 corresponds to the output divider B614, but does not have buffer circuits at the former stage unlike B614. And N609 is generated by N605 or N606. Therefore, N618 corresponds to N613 or N614 without delay A. In other words, the EOR gate B619 checks whether the phase of the output clock N618 of the sub-divider B618, which does not have the problem of the delay A, and the phase of the negative phase output clock N614 of the output divider B614, are the same or the opposite. Then the D flip-flop 8620 inspects the phase of the output clock N618 (corresponding to N613 or N614) of the sub-divider 8618 using the negative phase trigger clock N606, in the same manner as in the first embodiment. And EOR gate B622 changes this phase inspection result N621 to a correct inspection result N629 according to the detection result, that is, the same (N619, N622=L) or the opposite (N619, N622=H), by the EOR gate B619. Because N618 corresponds to N613 or N614. The correct phase detection result is directly used as the phase correction signal N629.

As described above, according to the second embodiment, the sub-divider B618 of the first phase detection unit 65A need not drive a large load outside, hence the buffer circuits in the former stage are omitted like B614, and the above mentioned problem of generating a large difference between the delay A and the delay B in the D flip-flop B620 of the second phase detection unit is relaxed. Depending on whether the phase of the output signal N618 of the sub-divider B618 and the phase of the output clock N614 of the output divider B614 are the same or the opposite, the EOR gate B622 converts the detection signal N621 by the D flip-flop B620 of the second phase detection unit 65B into a more appropriate phase correction signal.

FIG. 23A1 and FIG. 23A2 and FIG. 24B1 and FIG. 24B2 are waveform diagrams of the divider according to the second embodiment. FIG. 23A1 and FIG. 23A2 each depicts a case of a normal startup, where FIG. 23A1 depicts a case in which the phase of the output clock N618 of the sub-divider B618 and the phase of the negative phase output clock N614 of the output divider B614 are the opposite (phases of N613 and N618 are the same, or phases of N614 and N618 are the opposite), and FIG. 23A2 depicts a case in which these phases are the same (phases of N613 and N618 are the opposite, or phases of N614 and N618 are the same) are depicted. FIG. 24B1 and FIG. 24B2 each depicts a case of an abnormal startup, where FIG. 24B1 depicts a case in which the phase of the output clock N618 of the sub-divider B618 and the phase of the negative phase output clock N614 of the output divider B614 are the opposite (phases of N613 and N618 are the same, or phases of N614 and N618 are the opposite), and FIG. 24B2 depicts a case in which these phases are the same (phases of N613 and N618 are the opposite, or phases of N614 and N618 are the same) are depicted.

FIG. 25 is a table summarizing the four operations depicted in FIG. 23 and FIG. 24. The four operations will now be described with reference to these drawings and the table.

A1 in FIG. 23 is a case when the phases of the output clocks N613 and N618 are the same, and the phases of N614 and N618 are the opposite (common phase/negative phase detection signal N622=H level). In this case, B620 of the second phase detection unit detects N618=H, and changes the detection signal N621 from L to H. In other words, this is a normal state. Since the common phase/negative phase detection signal N622 is in H level, B622 of the correction signal generation circuit sets or converts the correction signal N629 to L level and does not interrupt the clock N605.

In A1 in FIG. 23, the common phase trigger clock N605 is temporarily interrupted first immediately after startup, but the interrupt is cleared in the next negative phase trigger clock N606 where the above mentioned normal state is detected.

A2 in FIG. 23 is a case when the phases of the output clock N613 and N618 are the opposite, and the phases of N614 and N618 are the same (common phase/negative phase detection signal N622=L level), which is the opposite state of A1. In this case, B620 of the second phase detection unit detects N618=L and the detection signal N621 is in L. In other words, this is a normal state. Since the common phase/negative phase detection signal N622 is in L level, B622 of the correction signal generation circuit sets or maintains the correction signal N629 to L level, and does not interrupt the clock N605.

B1 in FIG. 24 is a case when the phases of the output clocks N613 and N618 are the same, and the phases of N614 and N618 are the opposite (common phase/negative phase detection signal N622=H level). In this case, B620 of the second phase detection unit detects N618=L, and sets the detection signal N621 to L. In other words, this is an abnormal startup state. Since the common phase/negative phase detection signal N622 is in H level, B622 of the correction signal generation circuit sets or converts the correction signal N629 to H level, and interrupts the clock N605. By this temporary interruption of the clock N605, the normal state is detected in the next timing, where the phase correction signal N629 is set to L level, and clock interruption is cleared.

B2 in FIG. 23 is a case when the phases of the output clocks N613 and N618 are the opposite, and the phases of N614 and N618 are the same (common phase/negative phase detection signal N622=L level) which is the opposite sate of B1. In this case, B620 of the second phase detection unit detects N618=H, and the detection signal N621 is in H. In other words, this is an abnormal state. Since the common phase/negative phase detection signal N622 is in L level, B622 of the correction signal generation circuit sets or maintains the phase correction signal N629 to H level, and interrupts the clock N605. By this temporary interruption of the clock N605, the normal state is detected in the next timing, where the phase correction signal N629 is set to L level, and clock interruption is cleared.

In FIG. 23 and FIG. 24, short pulses (glitches) are generated in the output N619, since the timings of the inputs N618 and N614 of the EOR gate B619 are shifted. In order to eliminate the influence of these glitches, the D flip-flop B621 is disposed, and the output N622 thereof is used as the common phase/negative phase detection result.

The advantage of the divider according to the second embodiment where the phase detection circuit is divided into two phase detection units will now be described in terms of the delay time.

Figure 26:
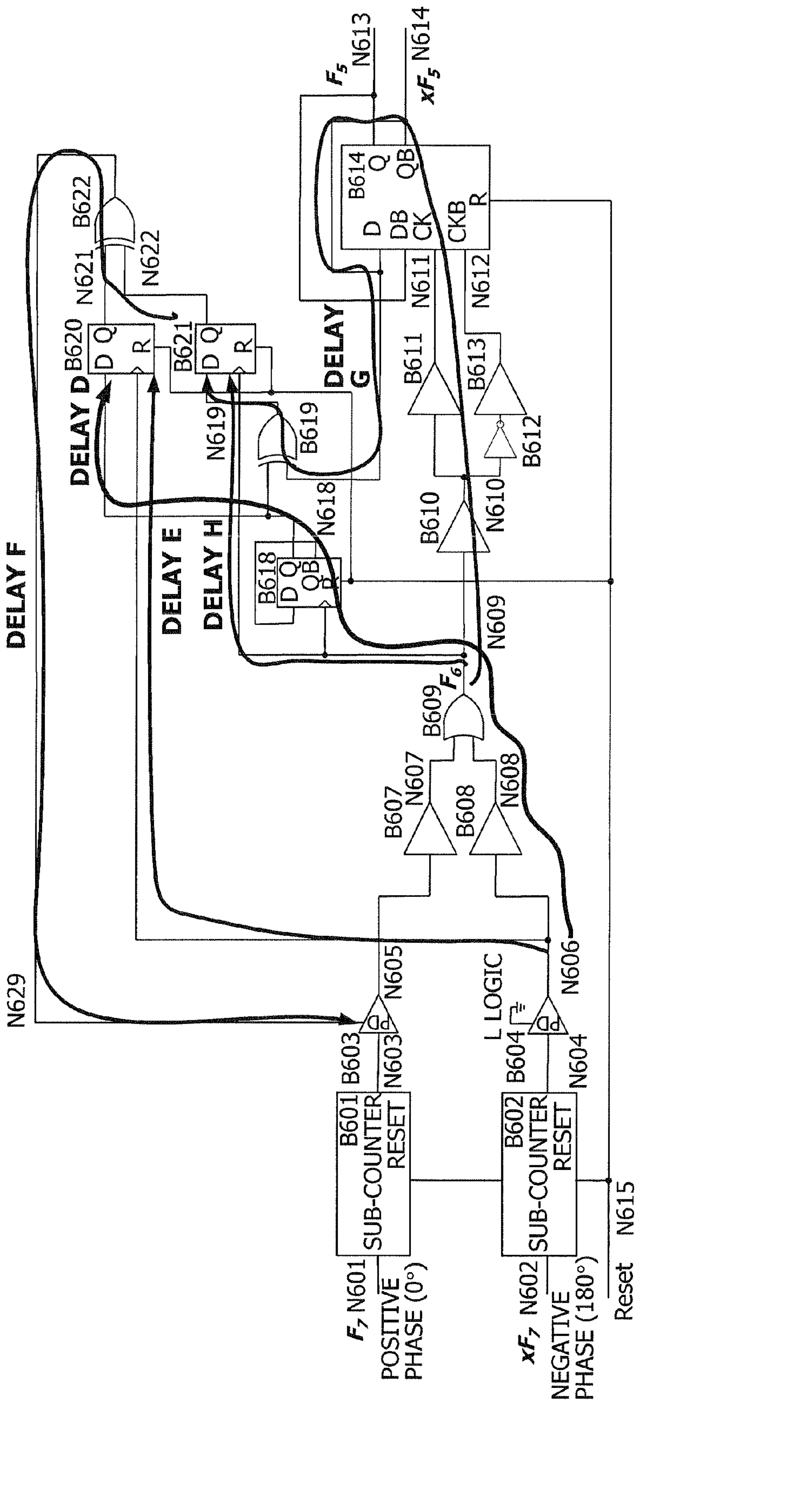
FIG. 26 illustrates the delay paths in the divider according to the second embodiment in FIG. 22.

FIG. 26 illustrates the delay paths in the divider according to the second embodiment in FIG. 22. A delay D takes a delay path from the node of the negative phase trigger pulse N606 to the data input terminal of the D flip-flop B620 of the second phase detection unit via the sub-divider B618. The delay E takes a delay path from the negative phase trigger pulse N606 to the clock input terminal of the D flip-flop B620 of the second phase detection unit. A delay F takes a delay path from the output terminal Q of the D flip-flop B621 of the first phase detection unit to the clock interrupting buffer B603.

For the D flip-flop B621 that removes the glitches in the first phase detection unit, a delay G takes a delay path from the node of the clock N609 to the data input terminal of the D flip-flop B621 via the output dividing circuit B614. A delay H takes a delay path from the node of the clock N609 to the clock input terminal of the D flip-flop B621.

When the difference of the delay D and the delay E becomes longer to be close to a half period of the clock at frequency F5, the D flip-flop B620 determines an incorrect logic, as mentioned above. Then when the difference between the delay G and the delay H becomes longer to be close to the half cycle of the clock at frequency F5, the glitches depicted in FIG. 23 and FIG. 24 are sampled, and the detection result indicates the opposite phase.

However, because the phase detection unit is divided into 2, the difference of the delay D and the delay E, and the difference of the delay G and the delay H, can be smaller than the difference of the delay A and the delay B depicted in FIG. 19. This is because a number of circuit blocks is small in the delay path G and the delay path D. As a result, a possibility to cause the above mentioned operation error can be decreased.

The phase correction circuit group 65A, 65B and 65C in the second embodiment can also be applied to the divider of the first embodiment. In this case, the phase correction signal N629 is input to the reset terminal of the output dividing circuit B614 via an OR gate.

Modification 1 of the Second Embodiment

Figure 27:
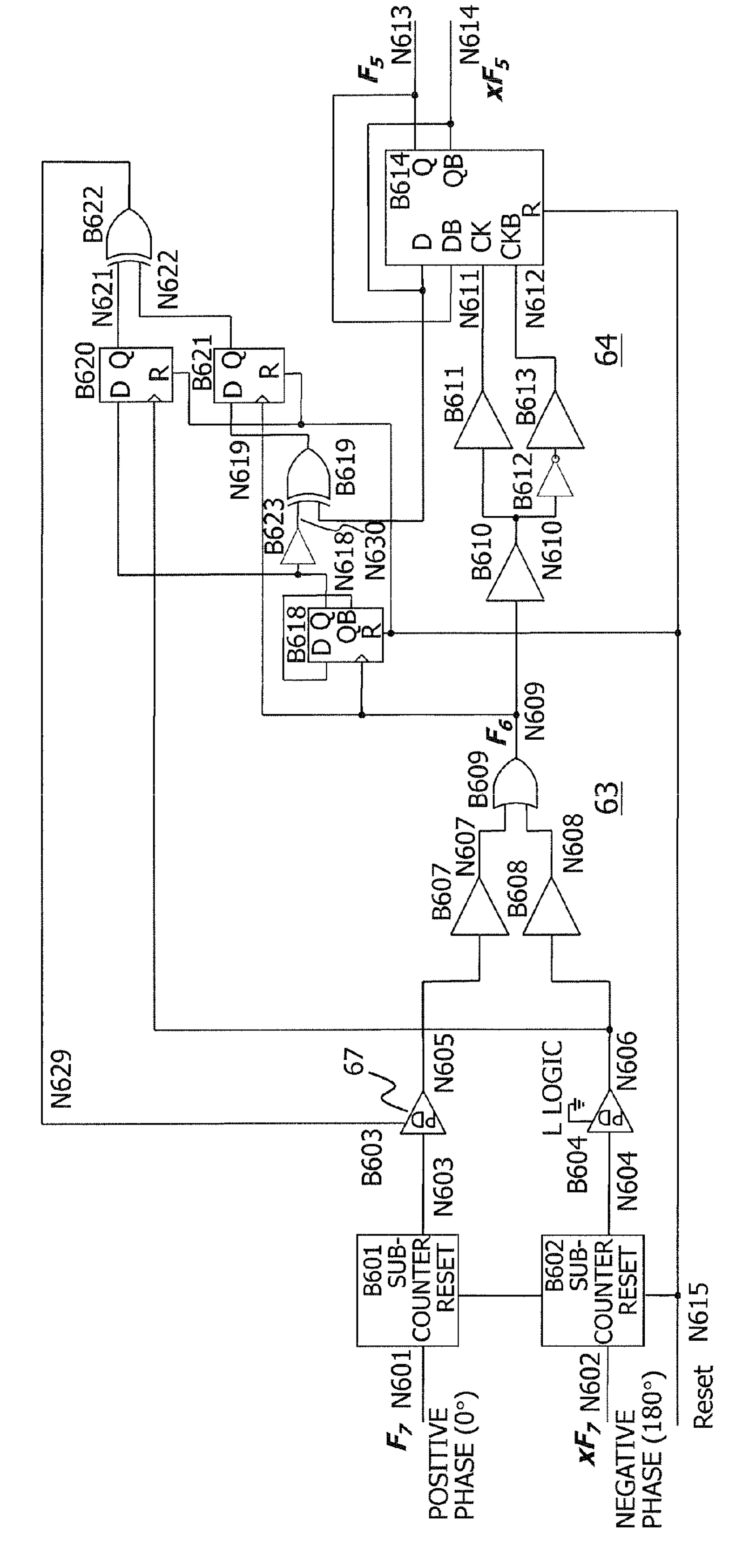
FIG. 27 is a circuit diagram of a modification 1 of the divider according to the second embodiment.
Figure 28:
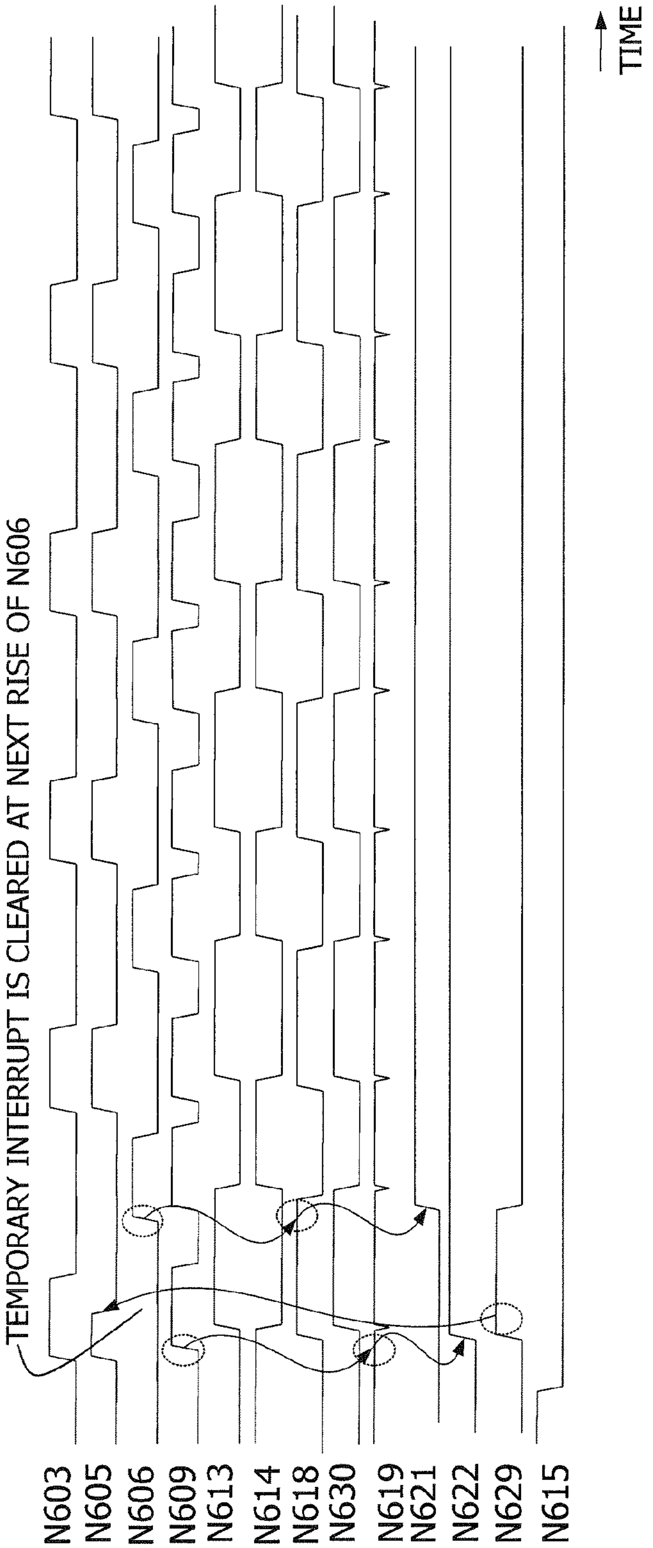
FIG. 28 is a waveform diagram of a modification 1 of the divider according to the second embodiment.

FIG. 27 is a circuit diagram of a modification 1 of the divider according to the second embodiment. FIG. 28 is a waveform diagram thereof. A difference of the divider in FIG. 27 from the divider in FIG. 22 is that a delay buffer B623 is included. The other configuration is the same.

In FIG. 23 and FIG. 24, it was described that glitches are generated in the output N619 by the shift of the timings of the two inputs N618 and N614 of the EOR gate B619. In the case of the divider in FIG. 27, the delay buffer B623 is disposed, therefore the shift of the timings of the two inputs N618 and N614 of the EOR gate B619 is decreased, and the glitch sizes of the output N619 are decreased. This is apparent if the glitch size is compared between N619 in FIG. 28 and N619 in FIG. 23 and FIG. 24. It is preferable that this delay buffer N623 has a delay time which corresponds to the delay of the circuit group B610 to B613 in the former stage of the output dividing circuit 64.

Modification 2 of the Second Embodiment

Figure 29:
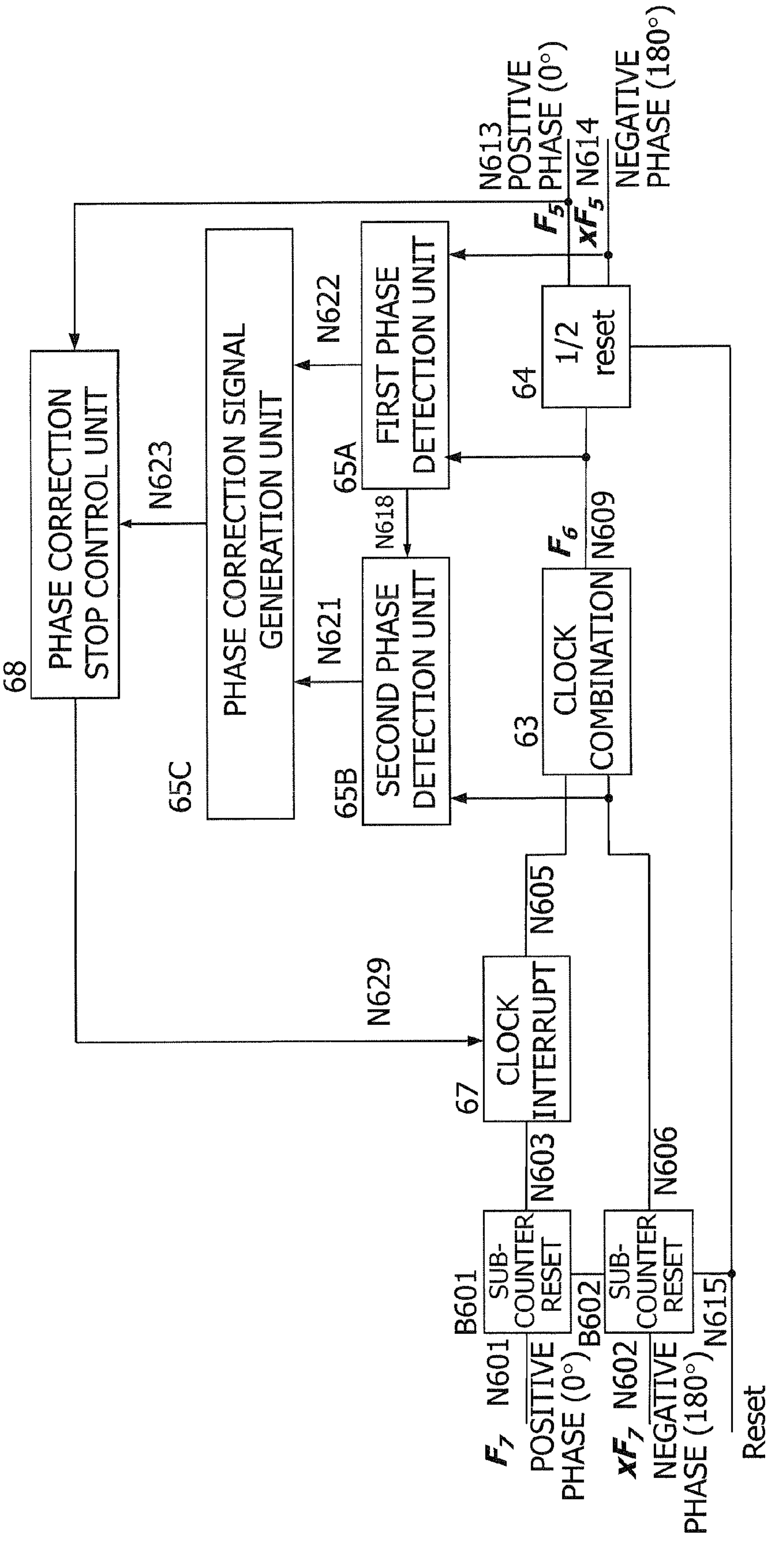
FIG. 29 is a block diagram of a modification 2 of the divider according to the second embodiment.
Figure 30:
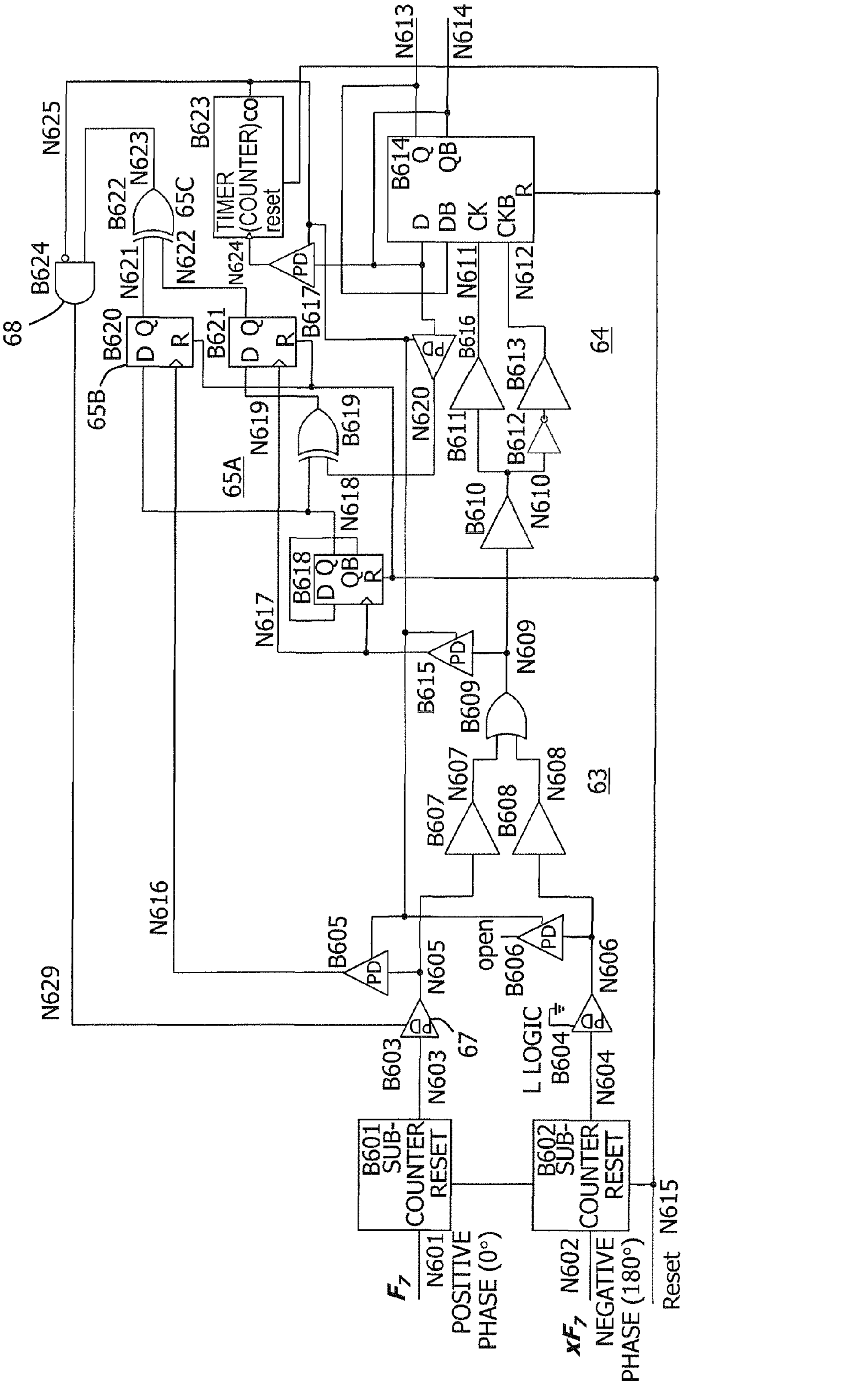
FIG. 30 is a circuit diagram of a modification 2 of the divider according to the second embodiment.

FIG. 29 is a block diagram of a modification 2 of the divider according to the second embodiment. FIG. 30 is a circuit diagram thereof. In order to save power consumption, this divider has a phase correction stop control unit 68. The phase correction stop control unit 68 stops operation of the circuits 65A, 65B and 65C for phase correction after phase correction is completed in the startup operation after a reset is cleared. Thereby unnecessary consumption of power can be prevented.

According to the circuit diagram in FIG. 30, the phase correction stop control unit 68 has a timer 8623 which counts the output clock N614 after reset is cleared, an AND gate B624 which stops the phase correction signal N623 for interrupting the clock by the time up output N625 of the timer B623, and a buffer group B605, B615, B616 and B617 which interrupt the passing of a pulse by the time up output N625. The buffer B606 is a dummy buffer for making node capacitance even. By determining an appropriate timing of a time up of the timer B623, the operation of the circuit group for phase correction is stopped after phase correction, so as to save the power consumption.

The modification 2 can also be applied to the divider of the first embodiment.

Modification 3 of the Second Embodiment

Figure 31:
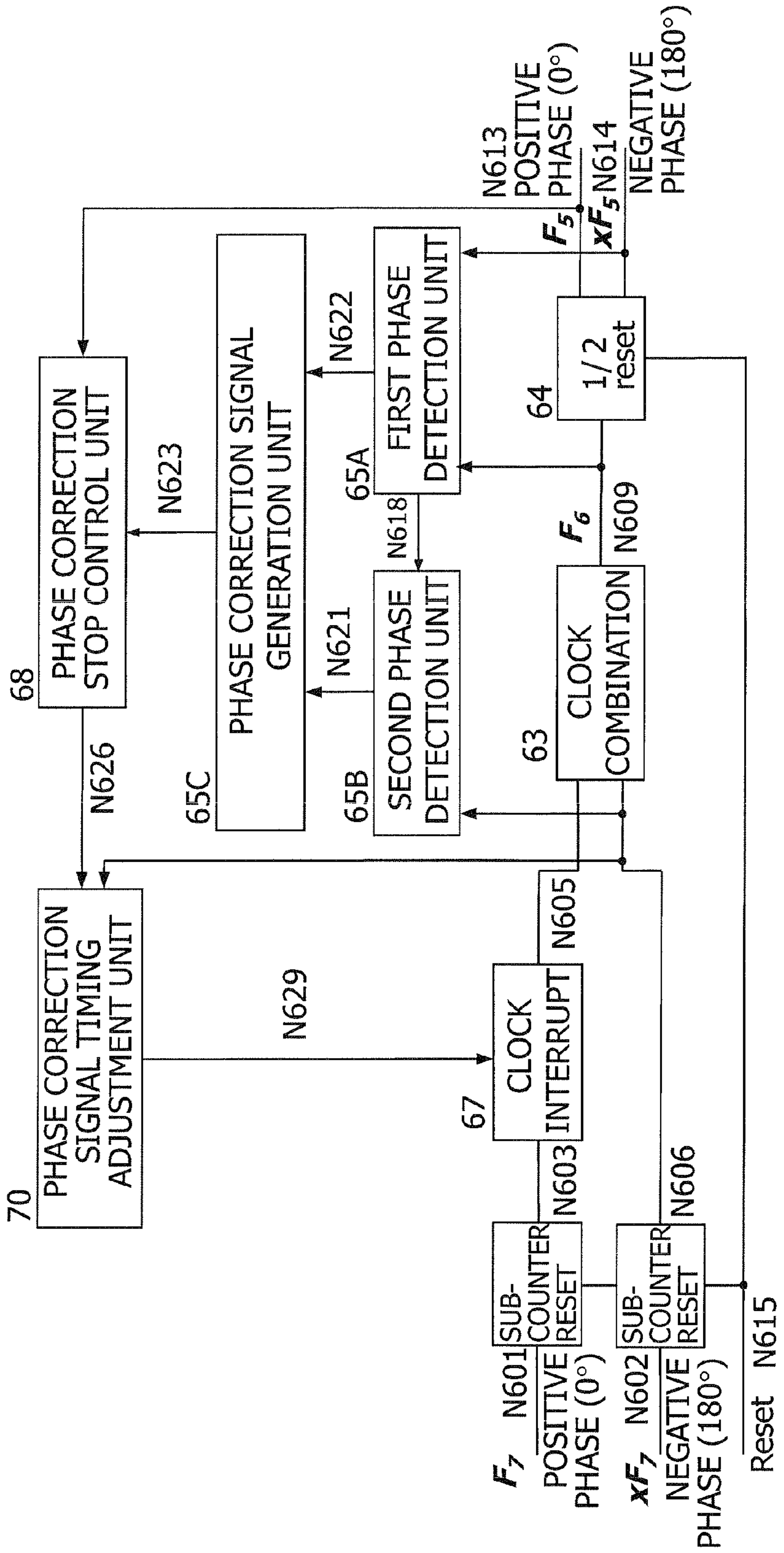
FIG. 31 is a block diagram of a modification 3 of the divider according to the second embodiment.
Figure 32:
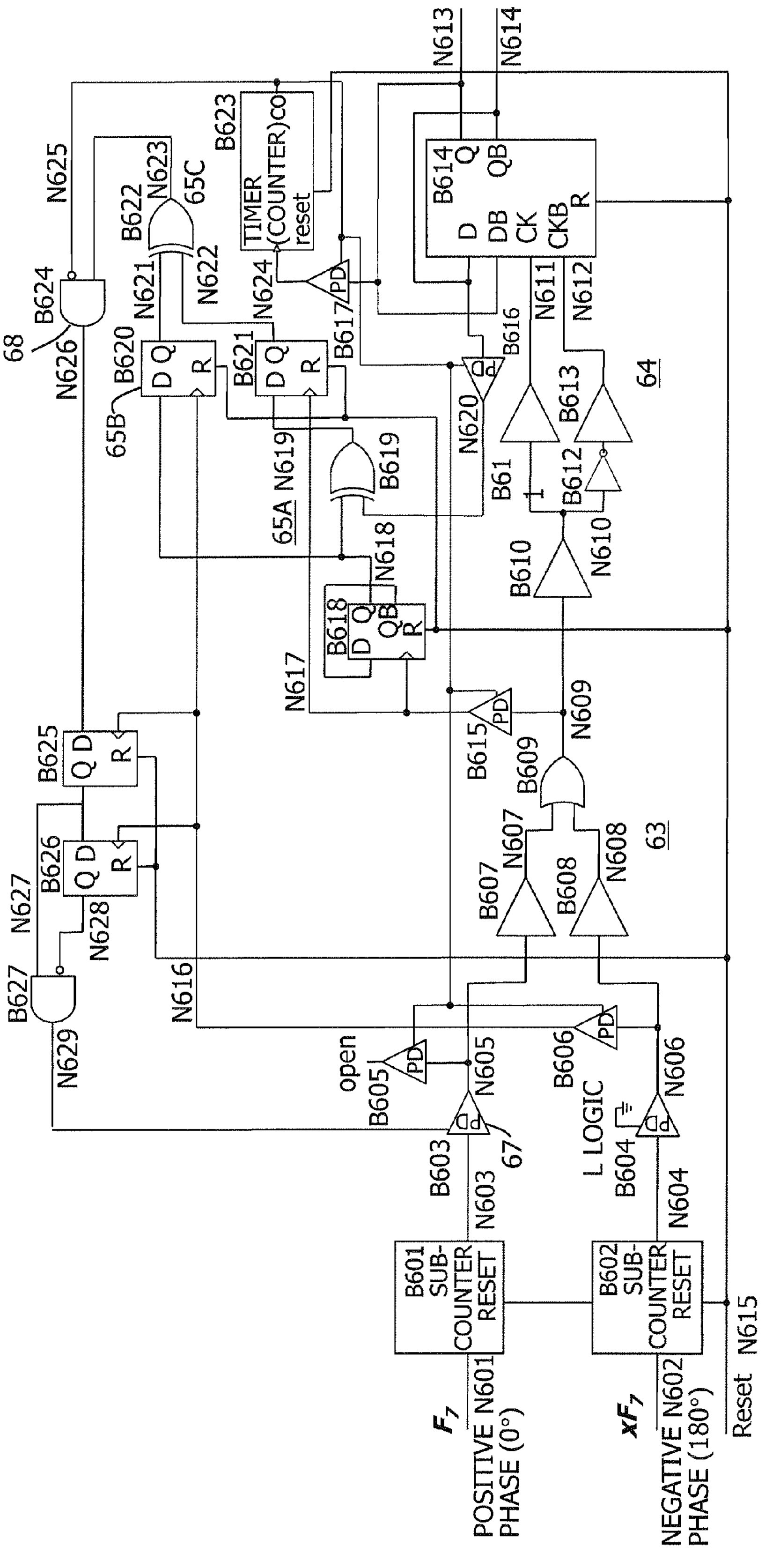
FIG. 32 is a circuit diagram of a modification 3 of the divider according to the second embodiment.

FIG. 31 is a block diagram of a modification 3 of the divider according to the second embodiment. FIG. 32 is a circuit diagram thereof. A case of FIG. 26 where the sum of the delay H and the delay F become about one cycle of the clock at frequency F5 is a case when the clock interrupting buffer B603 cannot interrupt the positive phase trigger clock at a right timing. This is the same as the interruption failure which is generated when the sum of the delay B and the delay C becomes about one cycle of the clock at frequency F5, as depicted in FIG. 19.

Therefore the divider in FIG. 31 and FIG. 32 has a phase correction signal timing adjustment unit 70. The phase correction signal timing adjustment unit 70 latches a phase correction signal N626 for clock interruption, which is generated by the phase correction signal generation unit 65C and the phase correction stop control unit 68 at a timing of a negative phase trigger pulse N606, generates a one-shot pulse having a pulse width, that is, one cycle of the negative phase trigger pulse N606, according to this timing, and outputs this shot pulse to the clock interrupting unit 67 as a timing-adjusted phase correction signal N629.

As the circuit diagram in FIG. 32 depicts, the phase correction signal timing adjustment unit 70 has a D flip-flop B625 which latches the phase correction signal N626 at the rise edge of the negative phase trigger pulse N606, a D flip-flop B626 and an AND gate 8627 which generate a one-shot pulse N629 having a pulse width, that is, one cycle of the negative phase trigger pulse N606, from the output N627.

Figure 33:
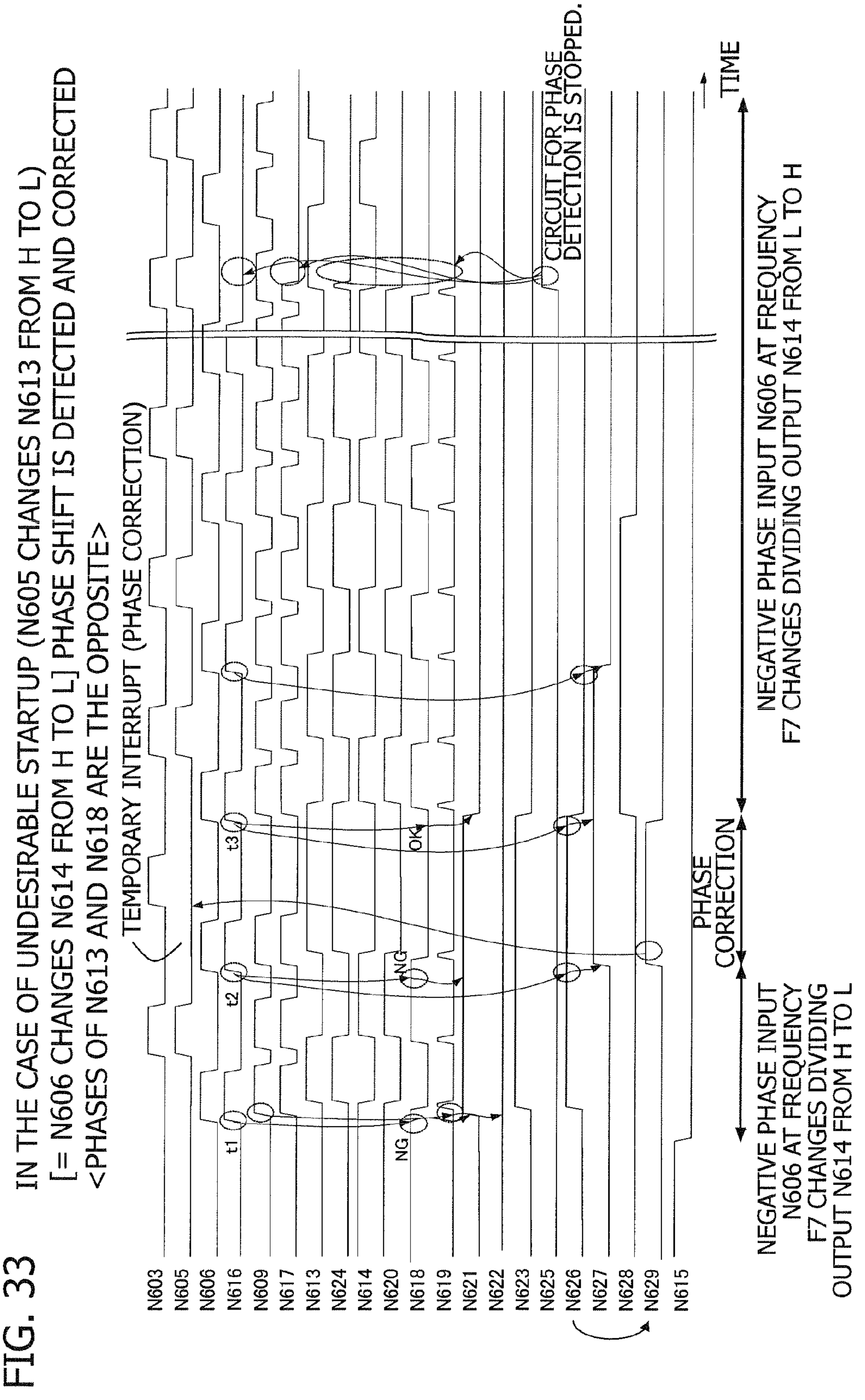
FIG. 33 is a waveform diagram depicting the operation of this divider.

FIG. 33 is a waveform diagram depicting the operation of this divider. FIG. 33 is a waveform diagram corresponding to FIG. 24B2. According to FIG. 33, it is detected that the negative phase output pulse N614 is in H level at the rise edge of the negative phase trigger pulse N606 at time t1, which is not a desirable startup operation, and the phase correction signal generation unit 65C generates phase correction signals N623 and N626. At time t2, the phase correction signal timing adjustment unit 70 latches the phase correction signal N626=H level at the rise edges of the next negative phase trigger pulses N606 and N616, and outputs the phase correction signal N629 having a pulse width until the next time t3. The timing-adjusted phase correction signal N629 is in H level according to the timing of the positive phase trigger pulse N605 of which passing should be interrupted. Thereby the clock interrupting buffer 8603 of the clock interrupting unit 67 can completely interfere with the positive phase trigger pulse N605.

The phase correction signal timing correction unit 70 of the modification 3 can also be applied to the divider having a clock interfering unit of the modifications 1 and 2 of the divider according to the first embodiment.

[Example of Mixer Circuit]

The dividers of the first and second embodiments generate a 90° phase shift of the local clock at high precision when used for a local clock generation circuit of the mixer circuit.

Figure 34A:
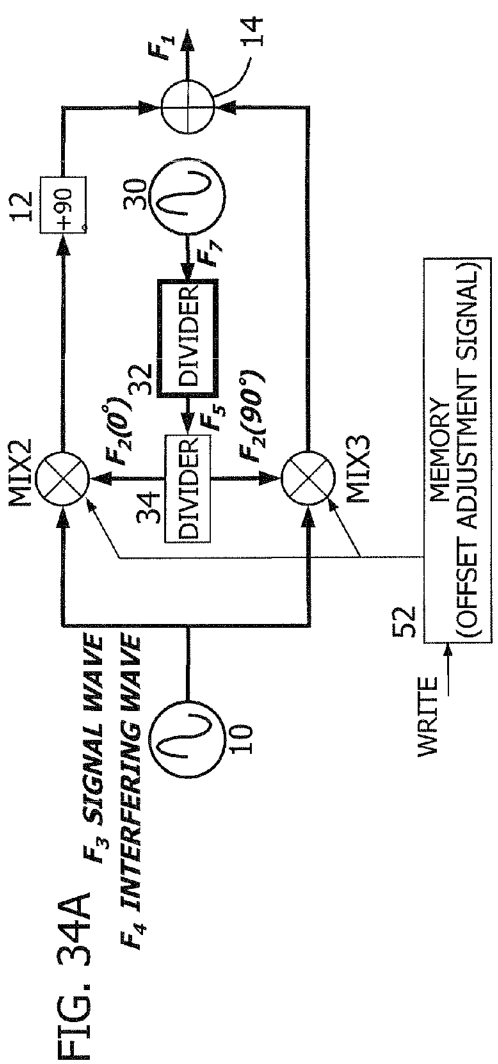
FIG. 34A and FIG. 34B illustrate examples of a mixer circuit having the divider of the present embodiment.
Figure 34B:
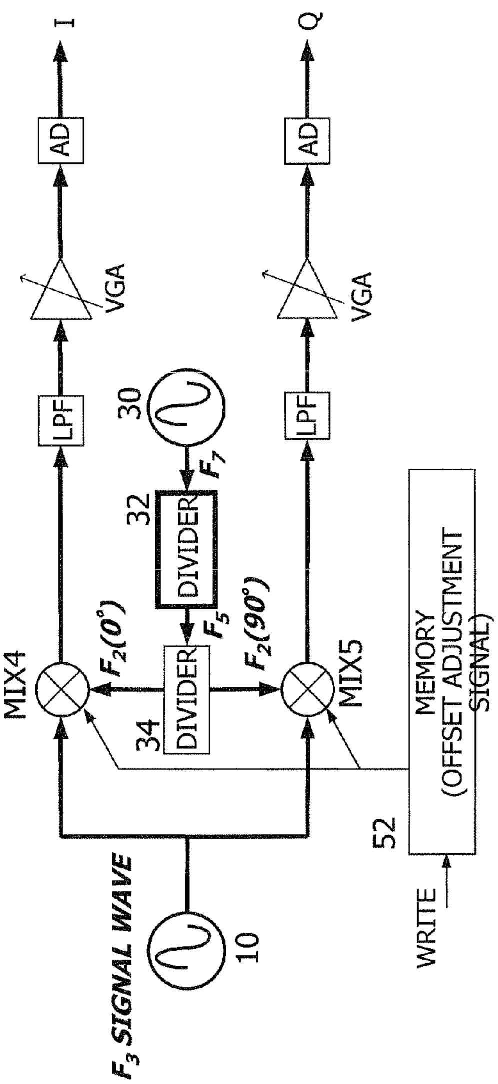

FIG. 34A and FIG. 34B illustrate examples of a mixer circuit having the divider of the present embodiment. FIG. 34A is a mixer circuit where the divider 32 is applied to the image removal mixer. In the same manner as in FIG. 1B, mixers MIX2 and MIX3 multiply a signal from a signal source 10 by a local clock of which phase is shifted 90°, a phase shifter 12 shifts the phase of the multiplied output of one mixer MIX2 by 90°, and a subtractor 14 subtracts an output signal of the other mixer MIX3 from the phase-shifted signal. Thereby the interfering F4 component is removed from the output signal at frequency F1.

A local clock generation circuit for generating local clocks F2 (0°) and F2 (90°) has a signal source 30, the divider 32 of the present embodiment, and a divider 34 which generates the local clocks F2 (0°) and F2 (90°) from the output clock F5 of the divider 32. The phase adjustment circuit depicted in FIG. 5 is disposed in the input stages of the mixers MIX2 and MIX3, and a set value for setting the bias voltage of the phase adjustment circuit is set in a memory 52.

A duty ratio of the output clocks of the divider 32 has only a shift in a certain direction, hence a fixed set value can also be set for the phase adjustment circuit. As a result, the duty ratio of the output clock is an ideal 0.5 and the divider 34 in the latter stage generates a local clock having a 90° phase difference with high precision.

FIG. 34B is a mixer circuit where the divider 32 is applied to an orthogonal demodulation circuit of a receiving apparatus. The mixers MIX4 and MIX5 multiply a signal F3 from a signal source 10, such as a reception antenna, by a local clock of which phase is shifted 90°, high frequency components are removed from each mixer output by a low pass filter LFP, the gain of the output is controlled to be constant by a variable gain amplifier VGA, and the result is converted into a digital signal by an AD convertor. Digital signals from an I channel and Q channel are demodulated and decoded in a digital processing circuit, which is not illustrated.

In this case as well, a local clock generation circuit for generating local clocks F2(0°) and F2(90°) has a signal source 30, the divider 32 of the embodiment, and a divider 34 which generates the local clocks F2(0°) and F2 (90°) from the output clock F5 of the divider 32. The phase adjustment circuit depicted in FIG. 5 is disposed in the input stages of the mixers MIX4 and MIX5, and a set value for setting the bias voltage of the phase adjustment circuit is set in a memory 52.

This mixer circuit is also known as an orthogonal modulation circuit of a transmitting apparatus. In the transmitting apparatus, two mixers multiply the encoded transmission signals of the I and Q channels by a local clock in the orthogonal modulation circuit, and the multiplied signals are transmitted from an antenna via a power amplifier. The divider 32 of the present embodiment is applied to the local clock generation circuit of this mixer circuit.

As described above, the divider of the present embodiment prevents the duty ratio of the output clock entering two states at random, and controls the duty ratio to be one certain state, hence this divider is effective as a divider which generates the input clock of the local clock generation circuit for which a phase difference with high precision is demanded.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention, have been described in detail, it should be understood that the various changes, substitutions, and alterations could be made hereto without departing from the spirit and scope of the invention.

What is claimed is:

1. A divider comprising:

a clock generation circuit which combines a first trigger clock and a second trigger clock having a first phase difference, so as to generate a third clock having pulse edges corresponding to pulse edges of the first trigger clock and the second trigger clock;

an output dividing circuit which divides the frequency of the third clock in half so as to generate a first differential output clock and a second differential output clock having a duty ratio corresponding to the first phase difference; and a phase correction circuit which detects a phase of the first output clock or the second output clock at a timing of the pulse edge of the first trigger clock or the second trigger clock, so as to generate a phase correction signal for resetting the output dividing circuit when the detected phase is not a normal phase.

2. A divider, comprising:

a clock generation circuit which combines a first trigger clock and a second trigger clock having a first phase difference, so as to generate a third clock having pulse edges corresponding to pulse edges of the first trigger clock and the second trigger clock;

an output dividing circuit which divides the frequency of the third clock in half so as to generate a first differential output clock and a second differential output clock having a duty ratio corresponding to the first phase difference;

a phase correction circuit which detects a phase of the first output clock or the second output clock at a timing of the pulse edge of the first trigger clock or the second trigger clock, so as to generate a phase correction signal for interrupting the first trigger clock or the second trigger clock to be input to the clock generation circuit when the detected phase is not a normal phase; and a clock interrupting circuit which interrupts the first trigger clock or the second trigger clock in response to the phase correction signal.

3. The divider according to claim 1 or 2, wherein the clock generation circuit has a clock combining circuit which combines the first trigger clock and the second trigger clock, so as to generate the third clock.

4. The divider according to claim 1 or 2, wherein the phase correction circuit has a flip-flop circuit which latches H level or L level of the first output clock or the second output clock in response to the pulse edge of the first trigger clock or the second trigger clock, so as to generate the phase correction signal corresponding to the latched H level or L level.

5. The divider according to claim 1 or 2, wherein the phase correction circuit has:

a sub-dividing circuit which divides the third clock in half so as to generate a sub-divided clock;

a first phase detection circuit which detects a phase of the sub-divided clock in response to the pulse edge of the first trigger clock or the second trigger clock so as to output a first detection clock;

a second phase detection circuit which detects whether the phase of the sub-divided clock and the phase of the first output clock or the second output clock are the same or opposite, in response to the third clock so as to output a second detection clock; and a phase correction signal generation circuit which outputs the phase correction signal by inverting or not inverting the first detection clock according to the second detection clock.

6. The divider according to claim 5, wherein the phase correction circuit further has a delay circuit which delays the sub-divided clock so that the positive phase timing and the negative phase timing of the sub-divided clock and the first output clock or the second output clock match, and the second phase detection circuit inputs the sub-divided clock via the delay circuit.

7. The divider according to claim 1 or 2, further comprising a phase correction stop circuit which stops the phase correction signal when a certain time elapses after reset is cleared.

8. The divider according to claim 2, further comprising:

a phase correction signal timing correction circuit which corrects the timing of the phase correction signal to the timing of the first trigger clock or the second trigger clock, wherein the clock interrupting circuit interrupts the second trigger clock or the first trigger clock in response to the phase correction signal of which timing has been corrected.

9. The divider according to claim 8, wherein the phase correction signal timing correction circuit outputs, as the phase correction signal of which timing has been corrected, a one-shot pulse of the phase correction signal generated at a timing corresponding to the second trigger clock or the first trigger clock.

10. The divider according to claim 3, wherein the clock combining circuit generates an OR signal of the first trigger clock and the second trigger clock, or a NAND signal of an inverted clock of the first trigger clock and an inverted clock of the second trigger clock.

11. The divider according to claim 3, wherein the clock combining circuit has a selection circuit which alternately selects a pulse of the first trigger clock and a pulse of the second trigger clock.

12. The divider according to claim 2, wherein the clock generation circuit has:

a first sub-counter and a second sub-counter which respectively divide a first input clock and a second input clock having opposite phases so as to generate the first trigger clock and the second trigger clock; and a clock combining circuit which combines the first trigger clock and the second trigger clock so as to generate the third clock, and the clock interrupting circuit is disposed between the first sub-counter or the second sub-counter, and the clock combining circuit.

13. The divider according to claim 2, wherein the clock generation circuit has:

a first sub-counter and a second sub-counter which respectively divide a first input clock and a second input clock having opposite phases so as to generate the first trigger clock and the second trigger clock; and a clock combining circuit which combines the first trigger clock and the second trigger clock so as to generate the third clock, and the clock interrupting circuit is disposed in the former stage of the first sub-counter or the second sub-counter.

14. The divider according to claim 1 or 2, wherein the output dividing circuit has:

a first latch circuit which latches an input in response to a first change edge out of the pulse edges of the third clock; and a second latch circuit which latches an output of the first latch circuit in response to a second change edge out of the pulse edges of the third clock and outputs a divided clock, and an inverted output of the second latch circuit is input to the first latch circuit.

15. A mixer circuit, comprising:

the divider according to claim 1 or 2;

a local clock generating divider which divides a first output clock and a second output clock of the divider so as to generate a first local clock and a second local clock having a second phase difference;

a first mixer circuit which multiplies a multiplication target signal by the first local clock; and a second mixer circuit which multiplies the multiplication target signal by the second local clock.

16. The mixer circuit according to claim 15, wherein the first mixer circuit or the second mixer circuit has a local clock phase adjustment circuit which adjusts a phase of the first local clock or the second local clock so that the second phase difference of the first local clock and the second local clock becomes 90°.

* * * * *